(12) United States Patent  (10) Patent No.: US 7,619,286 B2
Park  (45) Date of Patent: Nov. 17, 2009

(54) LIQUID CRYSTAL DISPLAY DEVICE AND METHOD OF FABRICATING THE SAME

(75) Inventor: Yong In Park, Anyang-si (KR)

(73) Assignee: LG Display Co., Ltd., Seoul (KR)

( * ) Notice: Subject to any disclaimer, the term of this patent is extended or adjusted under 35 U.S.C. 154(b) by 184 days.

(21) Appl. No.: 11/826,343

(22) Filed: Jul. 13, 2007

(65) Prior Publication Data

US 2008/0018821 A1    Jan. 24, 2008

Related U.S. Application Data

(62) Division of application No. 11/166,090, filed on Jun. 27, 2005, now Pat. No. 7,256,060.

(30) Foreign Application Priority Data

Nov. 12, 2004    (KR) .................. 10-2004-0092681

(51) Int. Cl.
    *H01L 27/108*    (2006.01)
(52) U.S. Cl. .................. 257/390; 257/88; 257/443; 257/E33.071; 257/E33.073; 438/29; 438/30; 349/62; 349/193
(58) Field of Classification Search .................. 257/88, 257/390, 443, E33.071, E33.073; 438/29, 438/30; 349/62, 193
See application file for complete search history.

(56) References Cited

U.S. PATENT DOCUMENTS 5,744,821 A * 4/1998 Song .................. 257/59
6,028,978 A * 2/2000 Takeuchi et al. .......... 385/147
6,403,409 B1   6/2002 You
6,617,203 B2   9/2003 Kim et al.
6,753,235 B2   6/2004 So et al.
2001/0003657 A1   6/2001 Lee
2004/0119903 A1 * 6/2004 Chang et al. .................. 349/43
2004/0207785 A1 * 10/2004 Jang et al. .................. 349/114

FOREIGN PATENT DOCUMENTS

JP    6-250217    9/1994
KR    97-003717 B1    3/1997
KR    97-008589 B1    5/1997

(Continued)

*Primary Examiner*—N Drew Richards
*Assistant Examiner*—Joannie A Garcia
(74) *Attorney, Agent, or Firm*—McKenna Long & Aldridge

(57) ABSTRACT

A poly-silicon liquid crystal display device with an improved aperture ratio and a simplified method of fabricating the same are disclosed. A liquid crystal display device according to the present invention includes first and second substrates; a gate line on the first substrate; a data line crossing the gate line to define a pixel region; a thin film transistor (TFT) near the crossing of the gate and data lines, the TFT having a gate electrode, a source electrode and a drain electrode; a pixel electrode in the pixel region, the pixel electrode having a double-layer structure in which a metal layer is formed on a transparent conductive layer; a black matrix on the second substrate, the black matrix having an aperture portion partially overlapping the pixel electrode and the drain electrode; and a liquid crystal layer between the first and second substrates.

14 Claims, 27 Drawing Sheets

FOREIGN PATENT DOCUMENTS

| | | |
|---|---|---|
| KR | 97-011966 B1 | 8/1997 |
| KR | 0161461 B1 | 8/1998 |
| KR | 0175408 B1 | 11/1998 |
| KR | 0177785 B1 | 11/1998 |
| KR | 0184509 B1 | 12/1998 |
| KR | 10-0192593 B1 | 1/1999 |
| KR | 2000-0025565 | 5/2000 |
| KR | 2000-0026894 | 5/2000 |
| KR | 2000-0026895 | 5/2000 |
| KR | 2000-0031451 | 6/2000 |
| KR | 2000-0041223 | 7/2000 |
| KR | 2000-0075031 | 12/2000 |
| KR | 2001-019665 | 3/2001 |
| KR | 2001-0019668 | 3/2001 |
| KR | 10-0297706 | 5/2001 |
| KR | 2001-0054739 | 7/2001 |
| KR | 2001-0055071 | 7/2001 |
| KR | 2001-0056037 | 7/2001 |
| KR | 2001-0110917 | 12/2001 |
| KR | 2002-0009188 | 2/2002 |
| KR | 2002-0022258 | 3/2002 |
| KR | 2002-0071061 | 9/2002 |
| KR | 2002-0071062 | 9/2002 |
| KR | 2002-0074897 | 10/2002 |
| KR | 2002-0078116 | 10/2002 |
| KR | 2002-0079196 | 10/2002 |
| KR | 2002-0080202 | 10/2002 |
| KR | 2003-0006619 | 1/2003 |
| KR | 2003-0030286 | 4/2003 |

\* cited by examiner

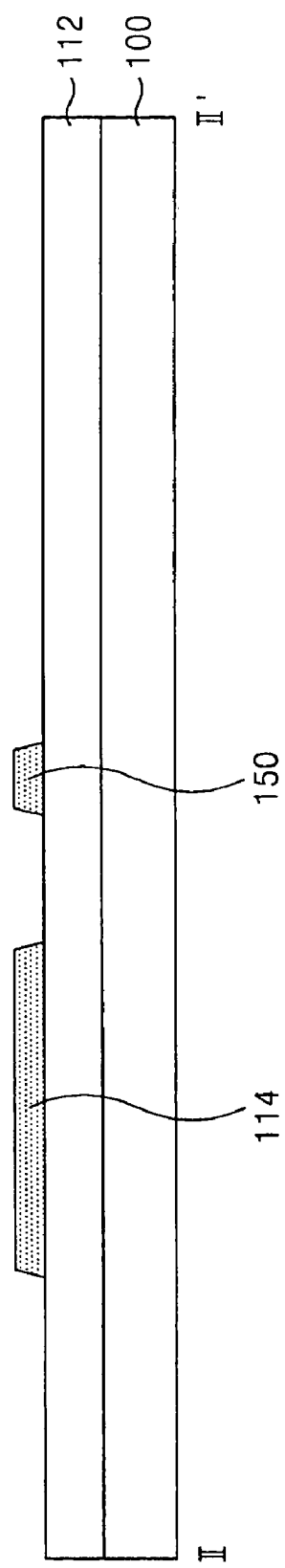

LIQUID CRYSTAL DISPLAY DEVICE AND METHOD OF FABRICATING THE SAME

This application is a divisional application of U.S. patent application Ser. No. 11/166,090, filed Jun. 27, 2005 now U.S. Pat. No. 7,256,060, now allowed, which claims priority to Korean Patent Application No. 10-2004-0092681, filed Nov. 12, 2004, all of which are incorporated by reference for all purposes as if fully set forth herein.

BACKGROUND OF THE INVENTION

1. Field of the Invention

This invention relates to a display device, and more particularly to a poly-silicon liquid crystal display device with an improved aperture ratio and a simplified method of fabricating the same.

2. Discussion of the Related Art

Generally, a liquid crystal display (LCD) device, which includes a plurality of liquid crystal cells in a matrix configuration in a liquid crystal display panel, displays images by controlling the transmittance of light in accordance with video signals. In each liquid crystal cell, a thin film transistor (TFT) is used as a switching device to independently supply a video signal. An active layer of such a TFT is generally formed of either amorphous silicon or polycrystalline silicon (poly-silicon). Because the carrier mobility of poly-silicon is approximately hundred times faster than the carrier mobility of amorphous silicon, high-speed driving circuits can be integrally formed in the LCD panel with the poly-silicon technology.

A poly-silicon LCD device generally includes a TFT substrate provided with driving circuits and a color filter substrate provided with a color filter, with liquid crystal provided therebetween.

FIG. 1 is a plan view illustrating a portion of a TFT substrate in a poly-silicon LCD device according to the related art, and FIG. 2 is a cross-sectional view of the TFT substrate taken along the line I-I' in FIG. 1.

Referring to FIGS. 1 and 2, the TFT substrate includes a thin film transistor (TFT) 30 connected to a gate line 2 and a data line 4, and a pixel electrode 22 connected to the TFT 30. Although either an NMOS-TFT or PMOS-TFT can be used for the TFT 30, the TFT 30 employing an NMOS-TFT will now be described.

The TFT 30 has a gate electrode 6 connected to the gate line 2, a source electrode connected to the data line 4, and a drain electrode 10 connected to the pixel electrode 22 via a pixel contact hole 20 passing through a protective film 18. The gate electrode 6 overlaps a channel area 14C of an active layer 14 provided on a buffer film 12 with a gate insulating film 16 therebetween. The source electrode and the drain electrode 10 are formed in such a manner to be insulated from the gate electrode 6 with an interlayer insulating film 26 therebetween. Further, the source electrode and the drain electrode 10 are connected to a source area 14S and a drain area 14D of the active layer 14 doped with an $n^+$ impurity, respectively, via a source contact hole 24S and a drain contact hole 24D passing through the interlayer insulating film 26 and the gate insulating film 16.

Such a TFT substrate of a poly-silicon LCD device can be fabricated by a six-mask process which is illustrated in FIG. 3A to FIG. 3F.

Referring to FIG. 3A, the buffer film 12 is formed on a lower substrate 1 and then the active layer 14 is formed on the buffer film 12 by a first mask process. The active layer 14 is formed by depositing an amorphous silicon layer on the buffer film 12 and then crystallizing it into a poly-silicon layer using a laser, and thereafter by patterning it with photolithography and etching processes using a first mask.

Referring to FIG. 3B, the gate insulating film 16 is formed on the buffer film 12 provided with the active layer 14 and then the gate line 2 and the gate electrode 6 are formed thereon by a second mask process. Then, an $n^+$ impurity is doped into a non-overlapping area of the active layer 14 using the gate electrode 6 as a mask, thereby forming a source area 14S and a drain area 14D of the active layer 14.

Referring to FIG. 3C, the interlayer insulating film 26 is formed on the gate insulating film 16 provided with the gate line 2 and the gate electrode 6, and then source and drain contact holes 24S and 24D passing through the interlayer insulating film 26 and the gate insulating film 16 are formed by a third mask process.

Referring to FIG. 3D, the data line 4 including the source electrode and the drain electrode 10 are formed on the interlayer insulating film 26 by a fourth mask process.

Referring to FIG. 3E, the protective film 18 is formed on the interlayer insulating film 26 provided with the data line 4 and the drain electrode 10, and then the pixel contact hole 20 passing through the protective film 18 is formed by a fifth mask process to expose the drain electrode 10.

Referring to FIG. 3F, the transparent pixel electrode 22 is formed on the protective film 18 by a sixth mask process.

As described above, the TFT substrate of the related art is formed by a six-mask process. Because each mask process includes many sub-processes such as deposition, cleaning, photolithography, etching, photo-resist stripping and inspection, etc., the manufacturing process is complicated and the manufacturing cost is high.

SUMMARY OF THE INVENTION

Accordingly, the present invention is directed to a poly-silicon display device and method of fabricating the same that substantially obviates one or more of the problems due to limitations and disadvantages of the related art.

An advantage of the present invention is to provide a poly-silicon liquid crystal display device with an improved aperture ratio and a simplified method of fabricating the same.

Additional advantages and features of the invention will be set forth in part in the description which follows and in part will become apparent to those having ordinary skill in the art upon examination of the following or may be learned from practice of the invention. These and other advantages of the invention may be realized and attained by the structure particularly pointed out in the written description and claims hereof as well as the appended drawings.

To achieve these and other advantages and in accordance with the purpose of the invention, as embodied and broadly described herein, a liquid crystal display device includes first and second substrates; a gate line on the first substrate; a data line crossing the gate line to define a pixel region; a thin film transistor (TFT) near the crossing of the gate and data lines, the TFT having a gate electrode, a source electrode and a drain electrode; a pixel electrode in the pixel region, the pixel electrode having a double-layer structure in which a metal layer is formed on a transparent conductive layer; a black matrix on the second substrate, the black matrix having an aperture portion partially overlapping the pixel electrode and the drain electrode; and a liquid crystal layer between the first and second substrates.

In another aspect of the present invention, a method of fabricating a liquid crystal display device includes providing first and second substrates; forming a gate line on the first substrate; forming a data line crossing the gate line to define a pixel region; forming a thin film transistor (TFT) near the crossing of the gate and data lines, the TFT having a gate electrode, a source electrode and a drain electrode; forming a pixel electrode in the pixel region, the pixel electrode having a double-layer structure in which a metal layer is formed on a transparent conductive layer; forming a black matrix on the second substrate, the black matrix having an aperture portion partially overlapping the pixel electrode and the drain electrode; and forming a liquid crystal layer between the first and second substrates.

In yet another aspect of the present invention, a method of fabricating a liquid crystal display device includes providing first and second substrates; forming a buffer layer on the first substrate; forming first and second active layers on the buffer layer; forming a first insulating film on the first and second active layers; forming a first conductive pattern including a gate electrode, a gate line, a storage line, and a pixel electrode, the first conductive pattern having a double-layer structure in which a metal layer is formed on a transparent conductive layer; forming a second insulating film on the first conductive pattern; forming source and drain contact holes exposing source and drain areas of the first active layer, and forming a transmission hole exposing the transparent conductive layer of the pixel electrode; forming a data line, a source electrode, and a drain electrode on the second insulating film; and forming the black matrix on the second substrate, the black matrix having an aperture portion partially overlapping the pixel electrode and the drain electrode.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings:

FIG. 6A to FIG. 6D are cross-sectional illustrating a method of fabricating the thin film transistor substrate illustrated in FIG. 5;

DETAILED DESCRIPTION OF THE ILLUSTRATED EMBODIMENTS

Reference will now be made in detail to embodiments of the present invention, examples of which are illustrated in the accompanying drawings.

Figure 1:
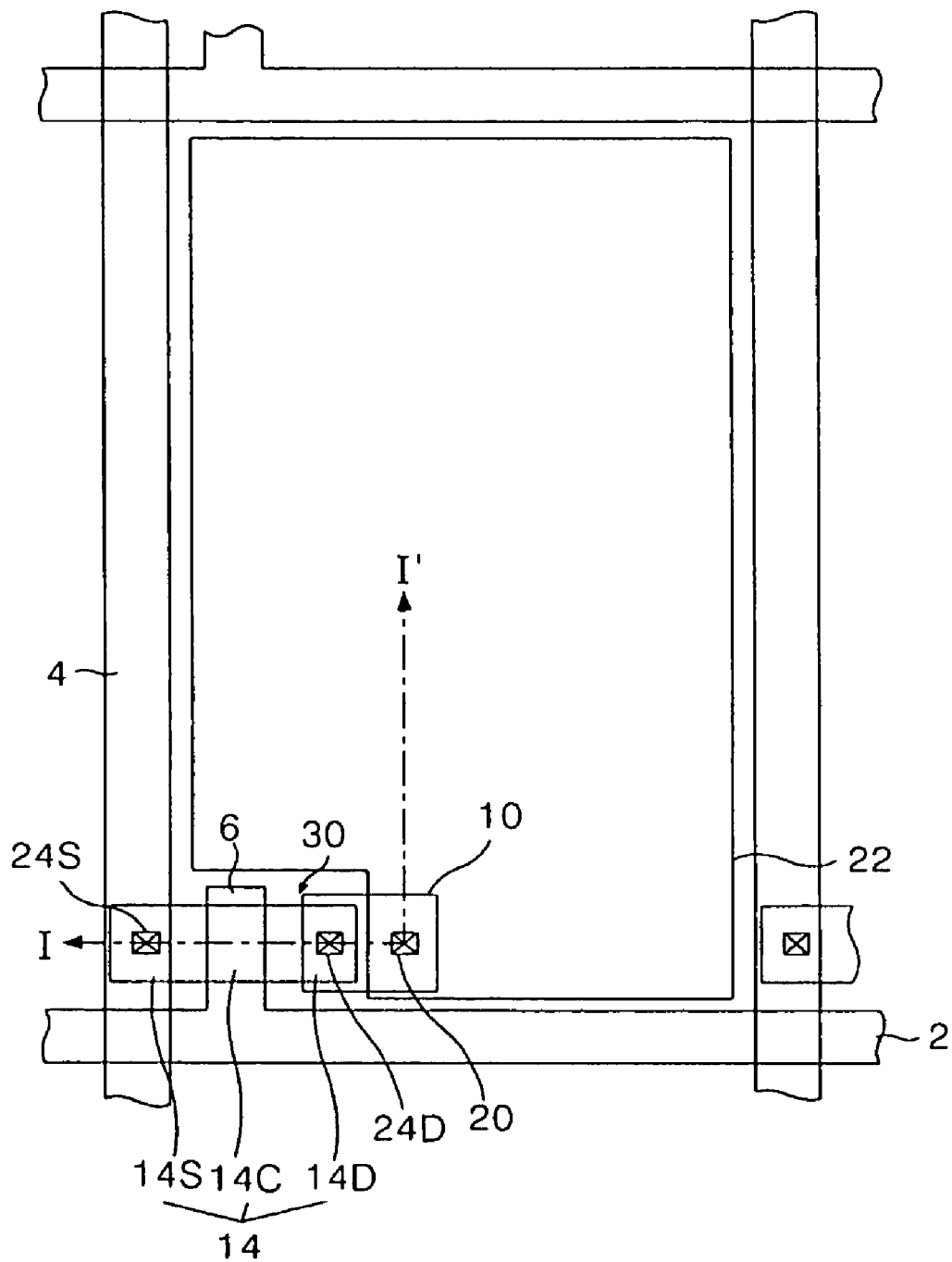
FIG. 1 is a plan view illustrating a portion of a TFT substrate in a poly-silicon LCD device according to the related art.
Figure 2:
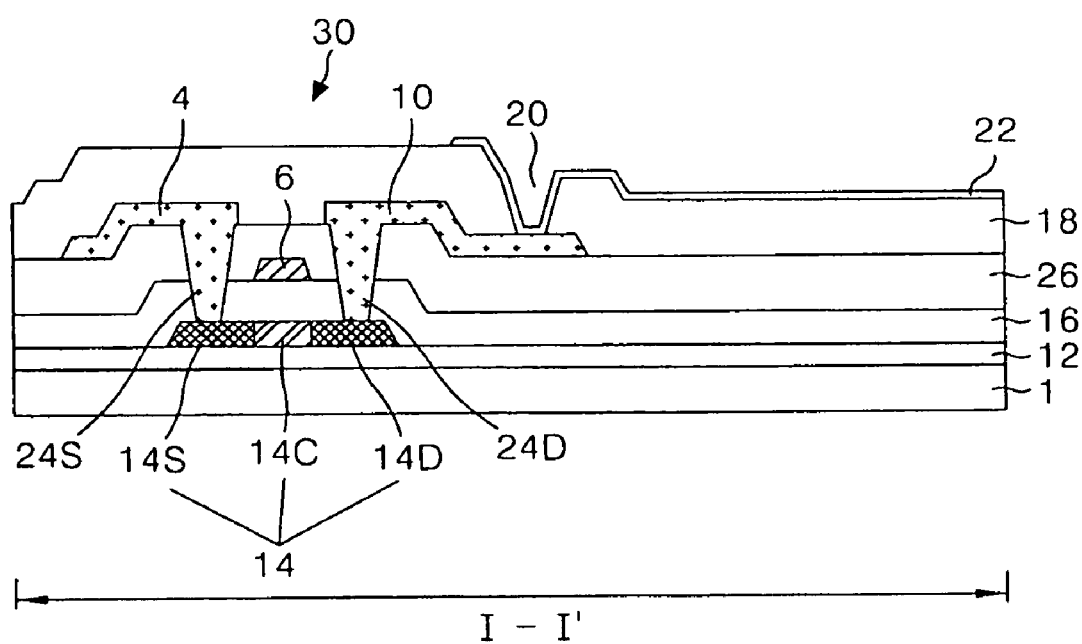
FIG. 2 is a cross-sectional view of the TFT substrate taken along the line I-I' in FIG. 1.
Figure 3A:
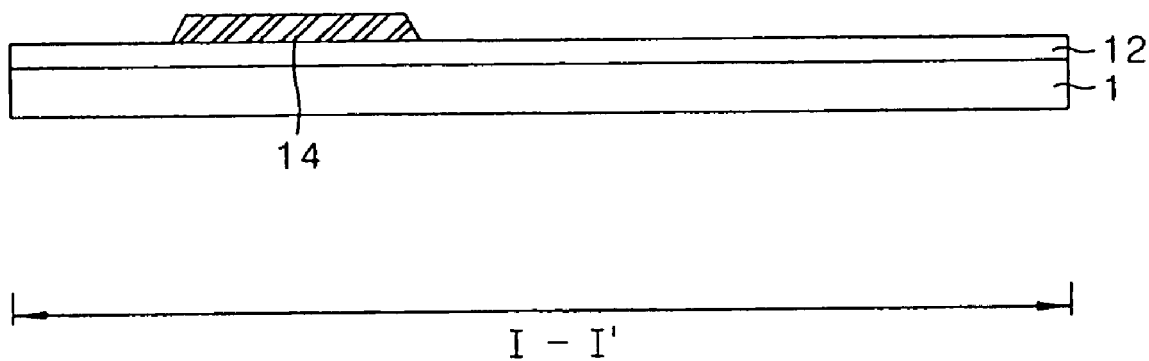
FIG. 3A to FIG. 3F are cross-sectional views illustrating a method of fabricating the thin film transistor substrate illustrated in FIG. 2.
Figure 3B:
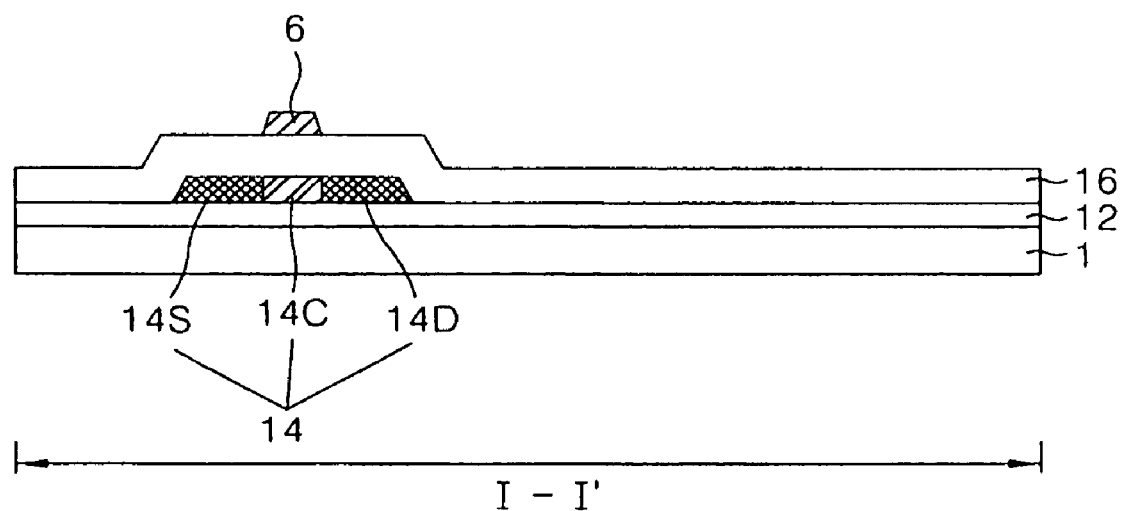
Figure 3C:
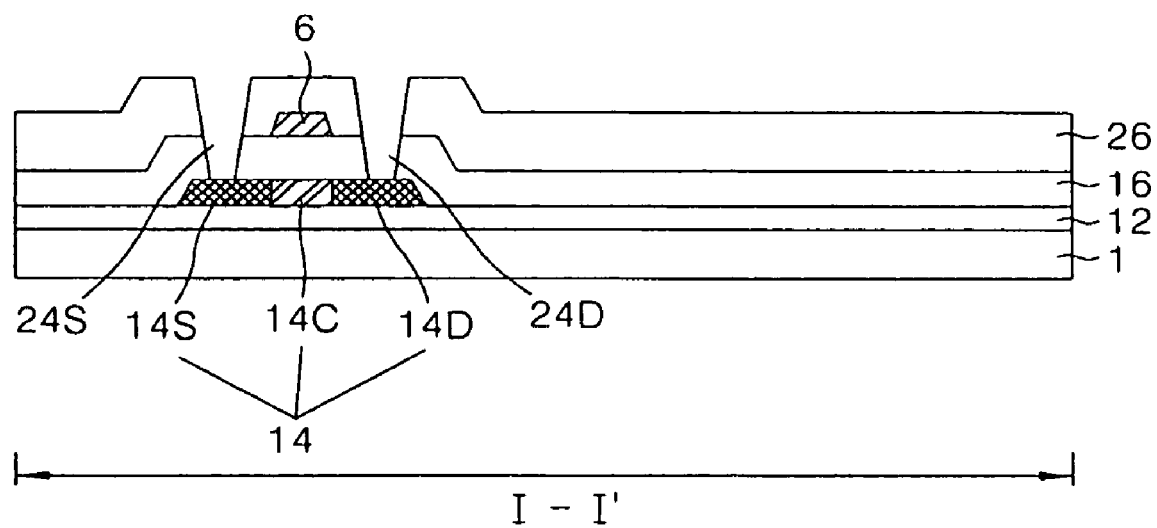
Figure 3D:
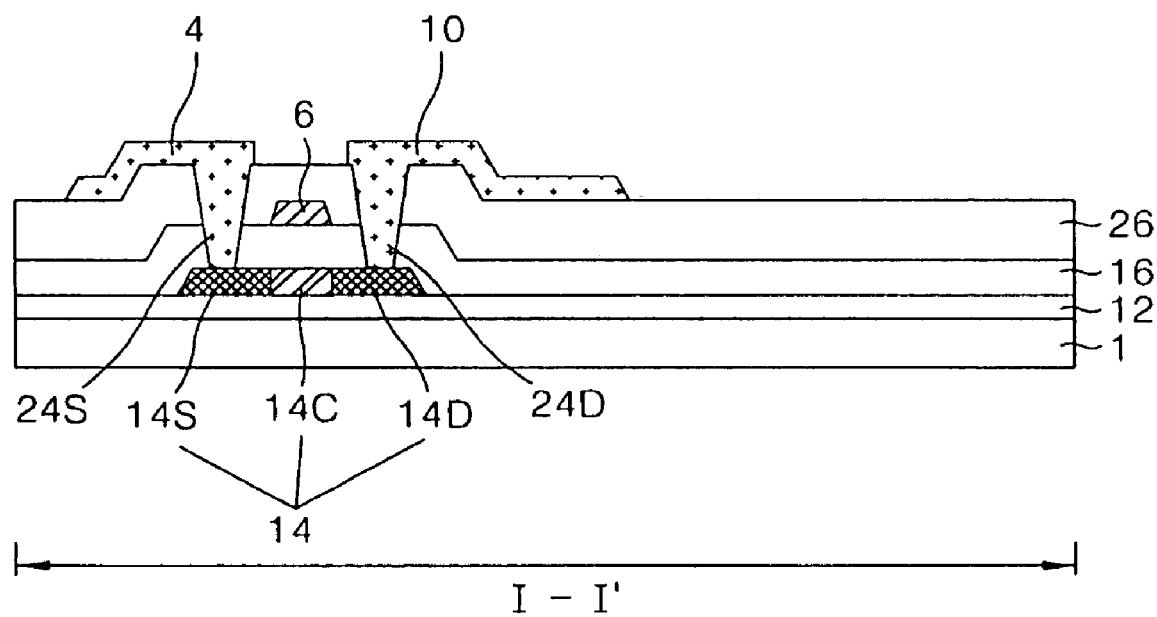
Figure 3E:
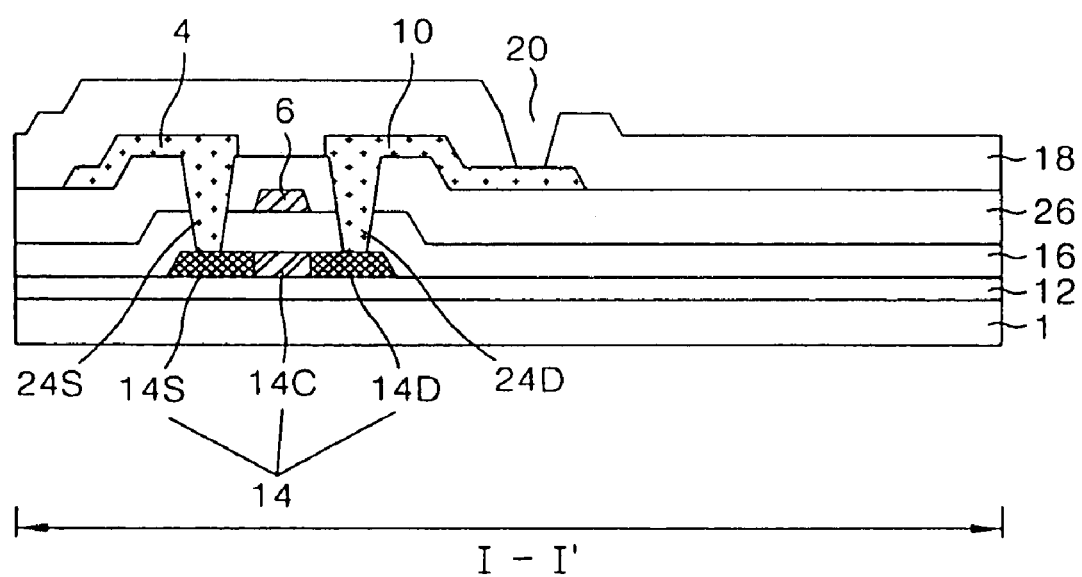
Figure 3F:
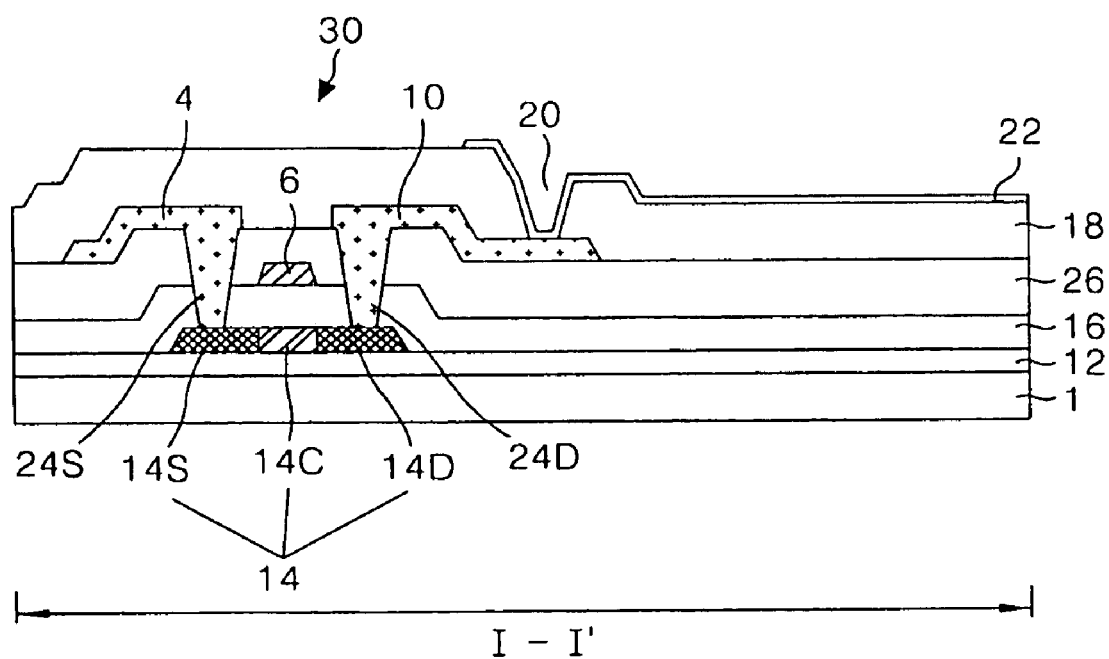
Figure 4:
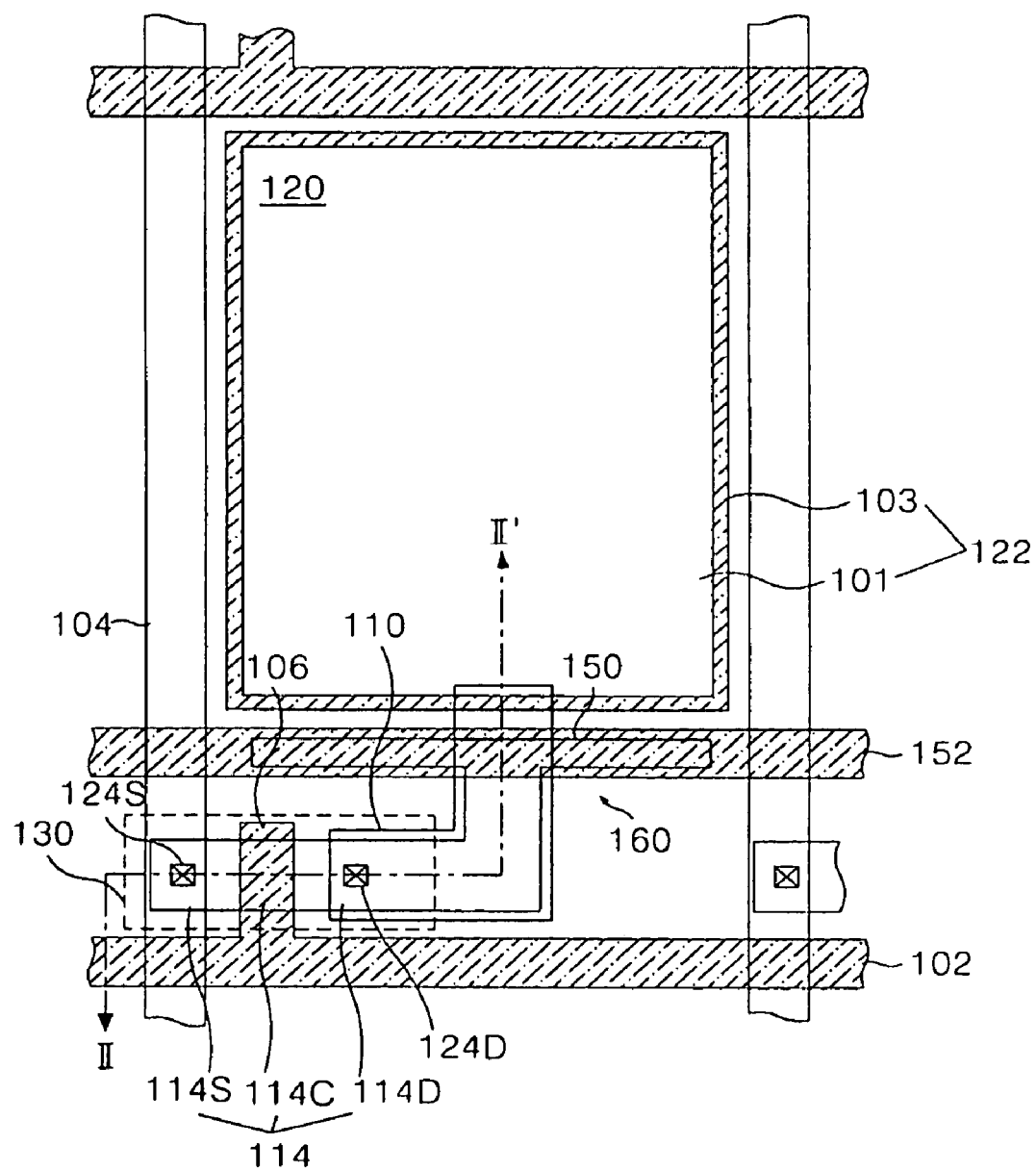
FIG. 4 is a plan view illustrating a portion of a thin film transistor substrate of poly-silicon liquid crystal display device according to a first embodiment of the present invention.
Figure 5:
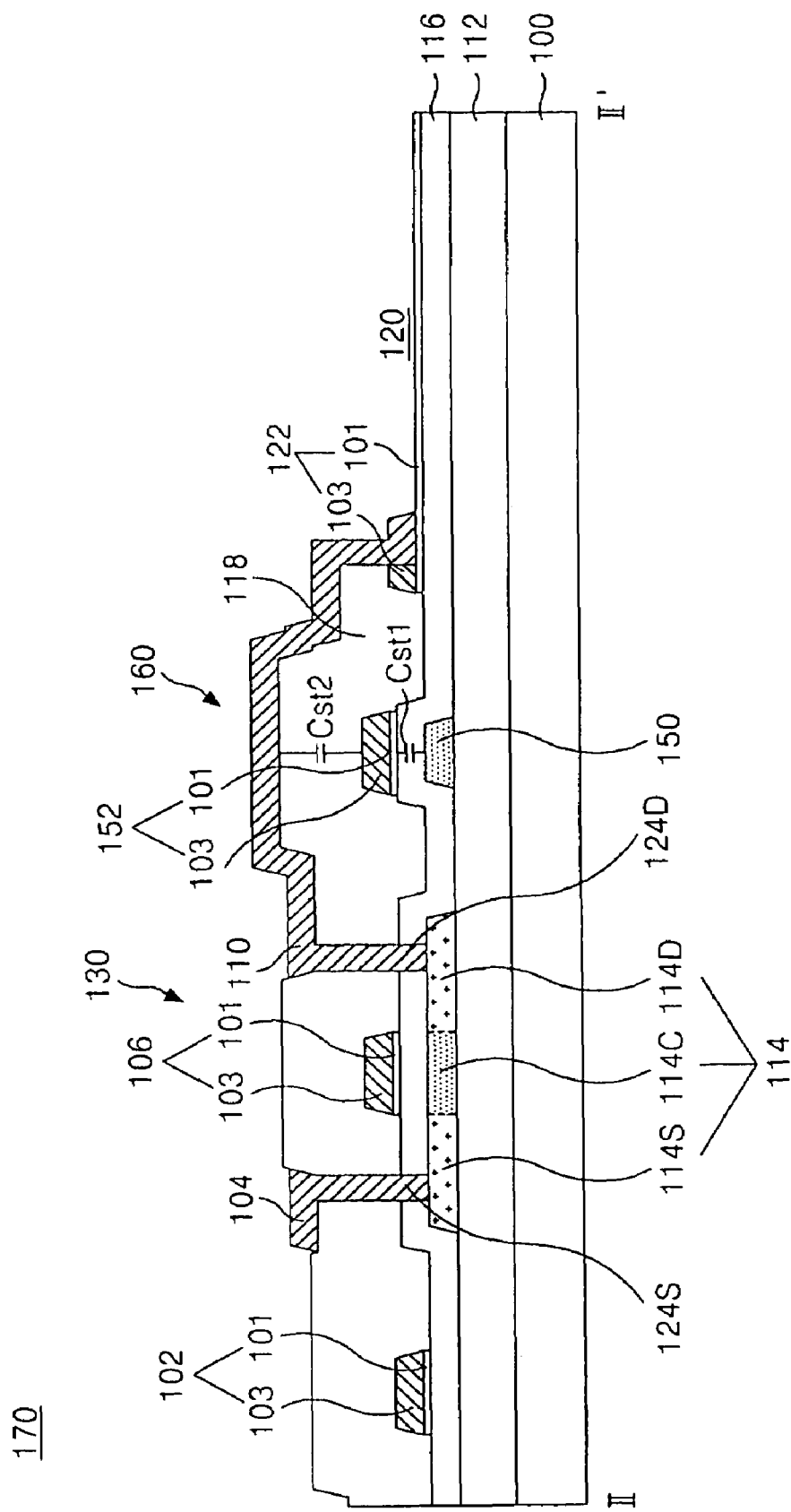
FIG. 5 is a cross-sectional view of the thin film transistor substrate taken along the line II-II' in FIG. 4.

FIG. 4 is a plan view illustrating a portion of a thin film transistor substrate of a poly-silicon liquid crystal display device according to a first embodiment of the present invention, and FIG. 5 is a cross-sectional view of the thin film transistor substrate taken along the line II-II' in FIG. 4.

Referring to FIGS. 4 and 5, the thin film transistor (TFT) substrate 170 includes a gate line 102 and a data line 104, a TFT 130 connected to the gate line 102 and the data line 104, a pixel electrode 122 and a storage capacitor 160 connected to the TFT 130, and a storage line 152 connected to the storage capacitor 160. Although the TFT 130 can be either an NMOS-TFT or PMOS-TFT, the TFT 130 employing an NMOS-TFT will now be described.

The data line 104 crosses the gate line 102 and the storage line 152 with an interlayer insulating film 118 therebetween to define a pixel area provided with the pixel electrode 122.

The TFT 130 applies a video signal on the data line 104 to the pixel electrode 122 in response to a gate signal from the gate line 102. To this end, the TFT 130 includes a gate electrode 106 connected to the gate line 102, a source electrode connected to the data line 104, a drain electrode 110 connected to the pixel electrode 122, and a first active layer 114 for defining a channel between the source electrode and the drain electrode 110.

The gate line 102 and the gate electrode 106, along with the storage line 152, have a double-layer structure in which a metal layer 103 is formed on a transparent conductive layer 101.

The first active layer 114 is formed on a lower substrate 100 with a buffer film 112 therebetween. The first active layer 114 has a channel area 114C overlapping the gate electrode 106 with a gate insulating film 116 therebetween, and a source area 114S and a drain area 114D doped with an $n^+$ impurity. The source area 114S and the drain area 114D of the first active layer 114 are connected to the source electrode and the drain electrode via a source contact hole 124S and a drain contact hole 124D passing through the interlayer insulating film 118 and the gate insulating film 116.

The pixel electrode 122 includes a transparent conductive layer 101 provided on the gate insulating film 116 in the pixel area, and a metal layer 103 along a periphery of the transparent conductive layer 101. In other words, the transparent conductive layer 101 of the pixel electrode 122 is exposed through a transmitting hole 120 passing through the interlayer insulating film 118 and the metal layer 103. Alternatively, the pixel electrode 122 may only include the transparent conductive layer 101 without the metal layer 103. The pixel electrode 122 crosses the storage line 152 and is connected to the drain electrode 110 extended along a side surface of the transmitting hole 120. More specifically, the drain electrode 110 is connected to the metal layer 103 and the transparent conductive layer 101 of the pixel electrode 122 exposed through the transmitting hole 120.

The TFT 130 charges a video signal into the pixel electrode 122 to generate a potential difference with respect to a common electrode of a color filter substrate (not shown). This potential difference rotates liquid crystal provided between the thin film transistor substrate and the color filter substrate due to the dielectric anisotropy of the liquid crystal, thereby controlling an amount of transmitted light inputted from a light source (not shown) via the pixel electrode 122 toward the color filter substrate.

The storage capacitor 160 includes first and second storage capacitors Cst1 and Cst2 connected in parallel between the storage line 152 and the TFT 130. The first storage capacitor Cst1 is provided such that the storage line 152 overlaps a second active layer 150 extended from the first active layer 114 with the gate insulating film 116 therebetween. The second storage capacitor Cst2 is provided such that the drain electrode 110 crosses the storage line 152 with the interlayer insulating film 118 therebetween. Because the storage capacitor 160 includes the first and second storage capacitors Cst1 and Cst2 connected in parallel, it has a high capacitance value. The storage capacitor 160 stably maintains a video signal charged in the pixel electrode 122 during a predetermined period of time.

As described above, in the TFT substrate 170 according to the first embodiment of the present invention, the pixel electrode 122, along with a double-layer structure of the gate line 102, the gate electrode 106 and the storage line 152, is formed on the gate insulating film 116. As a result, the TFT substrate can be fabricated by a four-mask process which is illustrated in FIG. 6A to FIG. 6D.

Referring to FIG. 6A, the buffer film 112 is formed on the lower substrate 100, and then the first and second active layers 114 and 150 are formed thereon by a first mask process.

To form the buffer film 112, an inorganic insulating film such as $SiO_2$, etc. is entirely deposited on the lower substrate 100. Next, an amorphous-silicon thin film is formed on the buffer film 112 by a low pressure chemical vapor deposition (LPCVD) technique or a plasma enhanced chemical vapor deposition (PECVD) technique, etc. and then is crystallized to form a poly-silicon thin film. A dehydrogenization process may be performed to eliminate hydrogen atoms existing in the amorphous-silicon thin film prior to the crystallization of the amorphous-silicon thin film.

Methods of crystallizing amorphous silicon are largely classified into the solid phase crystallization (SPC) method in which a thermal treatment is performed to crystallize amorphous silicon in a high-temperature furnace and the eximer laser annealing (ELA) method in which a laser is employed to crystallize amorphous silicon. The sequential lateral solidification (SLS) method, which is an example of the ELA method, is mainly used to crystallize the amorphous-silicon thin film in which grains grow in a horizontal direction to improve crystallization characteristics. The SLS method utilizes the principle that grains grow in a vertical direction with respect to an interface between liquid phase silicon and solid phase silicon. Thus, it is possible to grow grains in a horizontal direction to have a predetermined size by properly controlling the energy and irradiation range of the laser beam. The poly-silicon thin film is then patterned by photolithography and etching processes using a first mask to form first and second active layers 114 and 150.

Figure 6B:
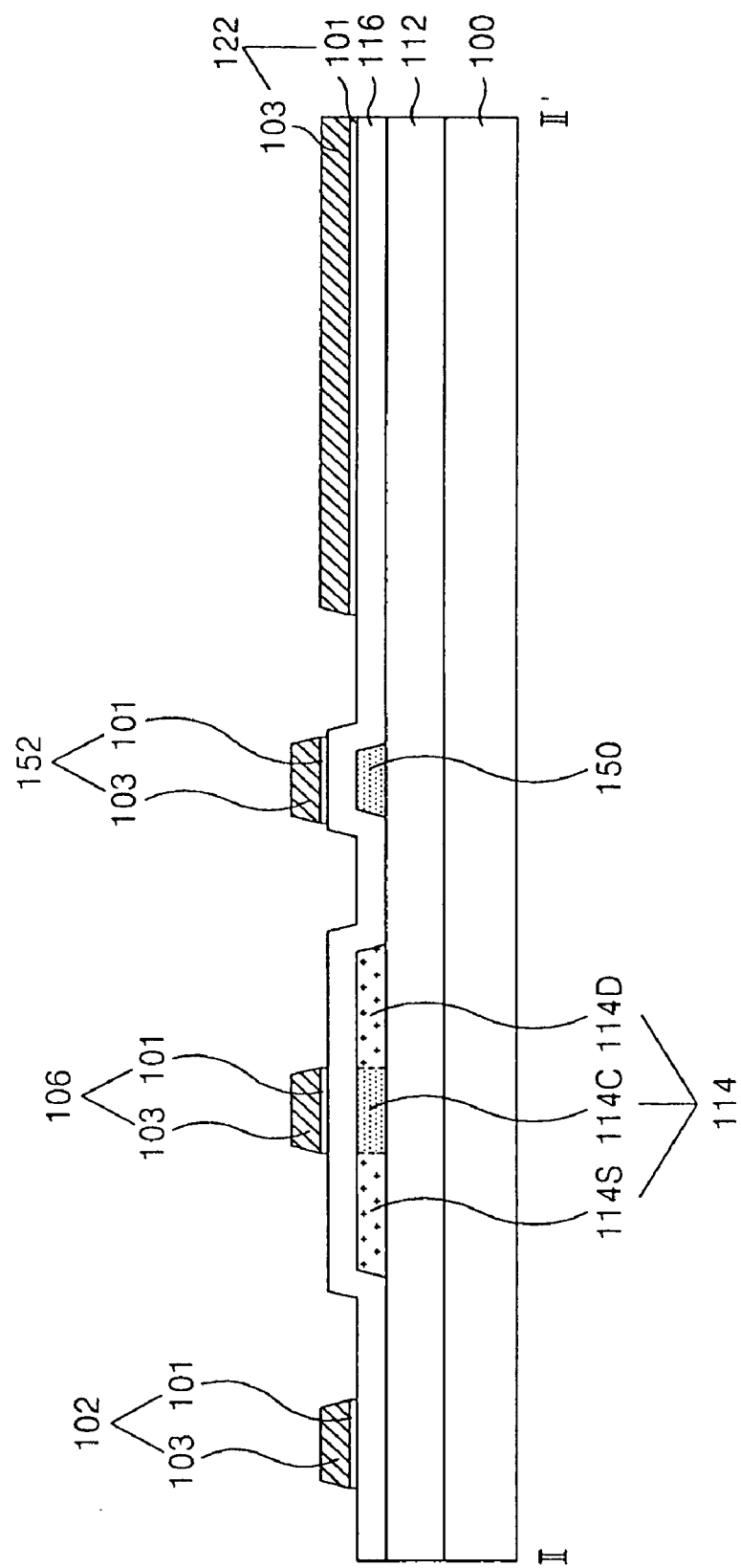

Referring to FIG. 6B, the gate insulating film 116 is formed on the buffer layer 112 provided with the first and second active layers 114 and 150. Then, the pixel electrode 122, the gate line 102, the gate electrode 106 and the storage line 152, all of which have a double-layer structure, are formed on the gate insulating film 116.

To this end, the gate insulating film 116, the transparent conductive layer 101 and the metal layer 103 are sequentially formed on the buffer film 112 provided with the first and second active layers 114 and 150. Then, the transparent conductive layer 101 and the metal layer 103 are patterned by photolithography and etching processes using a second mask to thereby form the gate line 102, the gate electrode 106, the storage line 152 and the pixel electrode 122.

Further, an $n^+$ type impurity is doped into the first active layer 114 using the gate electrode 106 as a mask to thereby form the source area 114S and the drain area 114D of the first active layer 114.

Figure 6C:
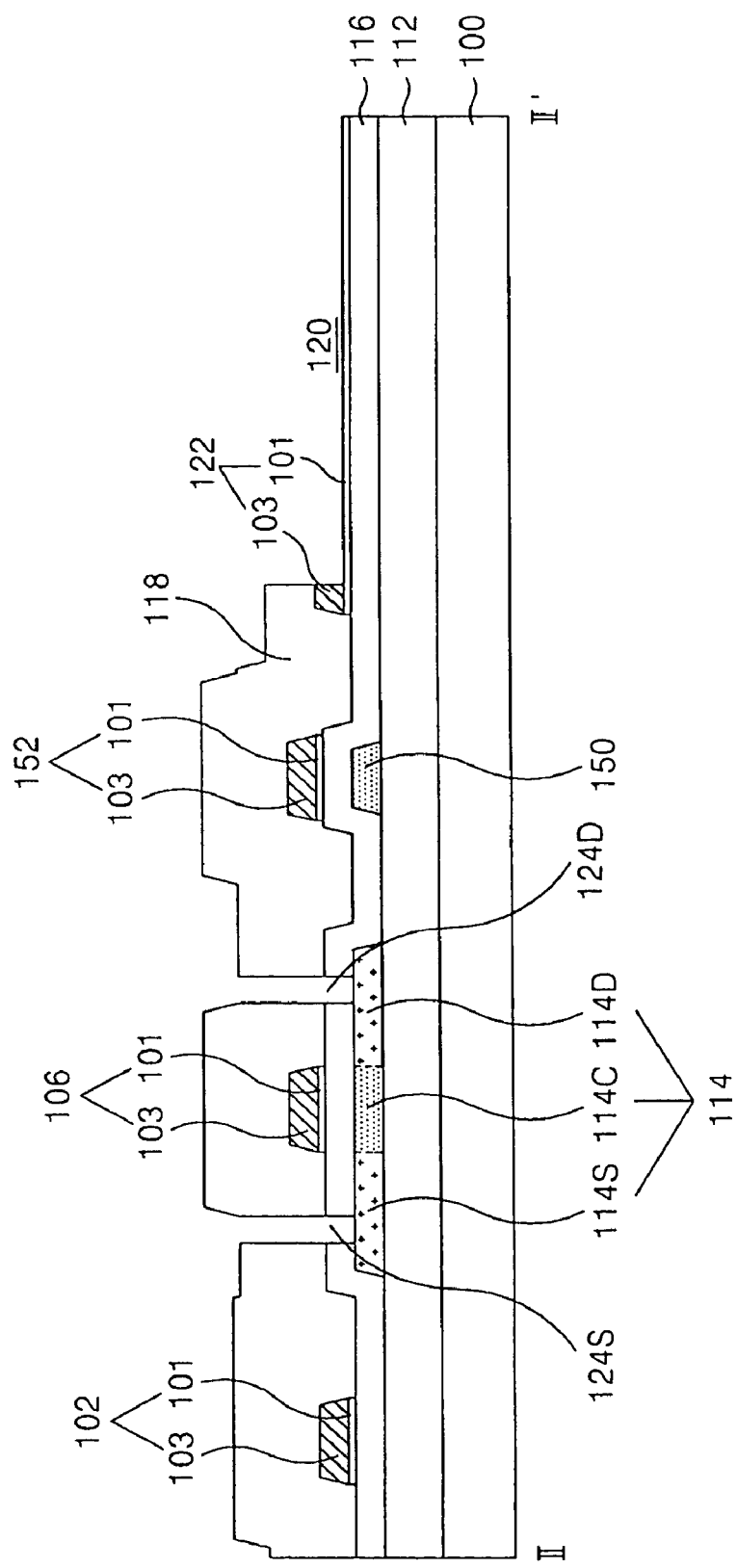

Referring to FIG. 6C, the source and drain contact holes 124S and 124D and the interlayer insulating film 118 having the transmitting hole 120 are formed by a third mask process.

The interlayer insulating film 118 is formed on the gate insulating film 116 provided with the gate electrode 106, the gate line 102, the storage line 152 and the pixel electrode 122. Then, the source and drain contact holes 124S and 124D passing through the interlayer insulating film 118 and the gate insulating film 116 to expose the source area 114S and the drain area 114D of the first active layer 114 and the transmitting hole 120 exposing the pixel electrode 122 are formed by photolithography and etching processes using a third mask. Further, the metal layer 103 of the pixel electrode 122 exposed through the transmitting hole 120 is etched to expose the transparent conductive layer 101.

Figure 6D:
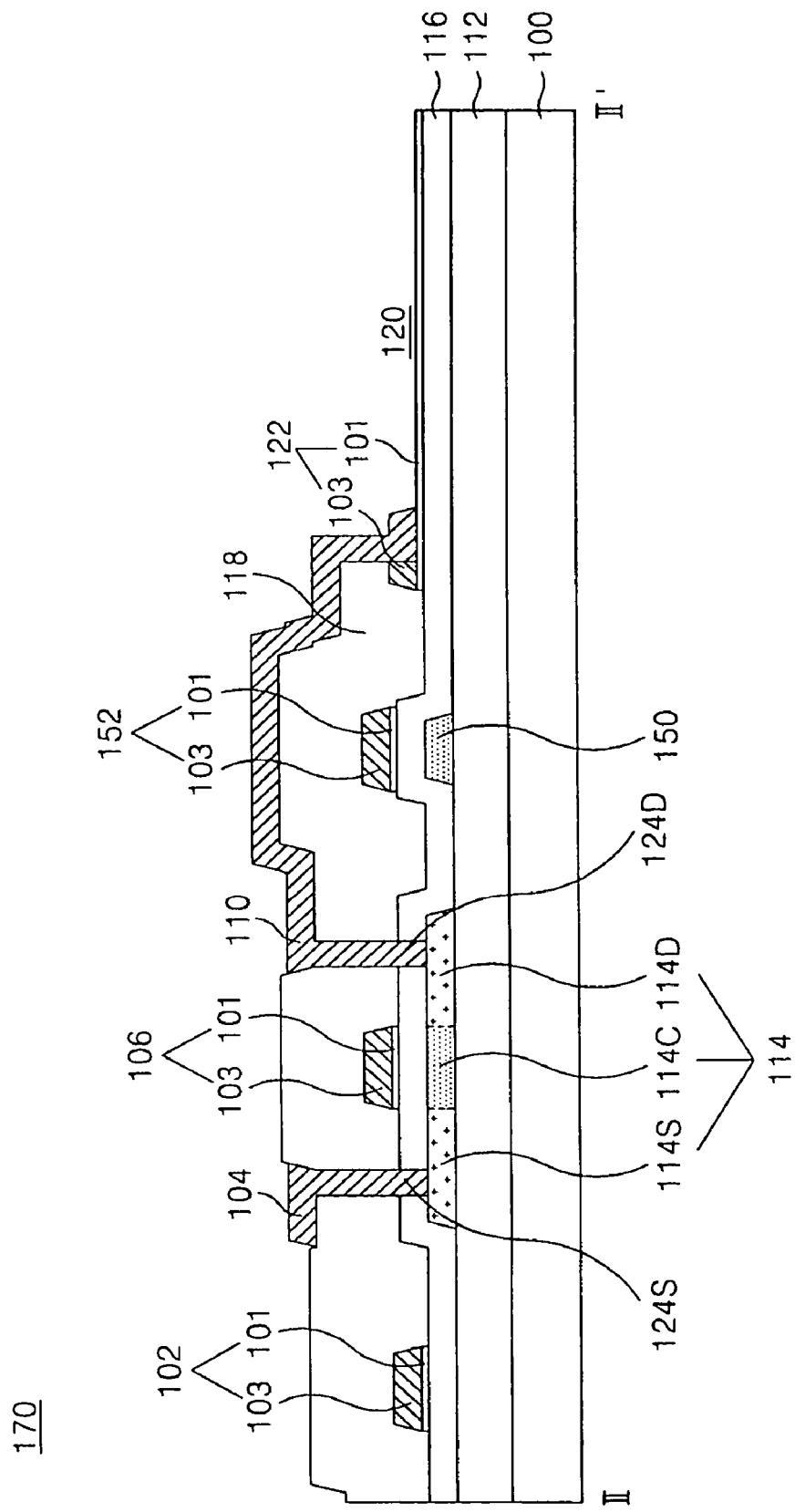

Referring to FIG. 6D, the data line 104 including the source electrode and the drain electrode 110 are provided on the interlayer insulating film 118 by a fourth mask process.

The data line 104 including the source electrode and the drain electrode 110 are formed by depositing a source/drain metal layer on the interlayer insulating film 118 and then patterning the source/drain metal layer by photolithography and etching processes using a fourth mask. The source electrode and the drain electrode 110 are connected to the source and drain areas 114S and 114D of the first active layer 114 via the source and drain contact holes 124S and 124D. The drain electrode 110 is extended across the storage line 152 and connected to the metal layer 103 of the pixel electrode 122 exposed through the transmitting hole 120 and the transparent conductive layer 101.

As described above, in the TFT substrate 170 according to the first embodiment of the present invention, the pixel electrode 122 is formed along with a double-layer structure of the gate line 102, the gate electrode 106 and the storage line 152, thereby simplifying the manufacturing process (four-mask process). As a result, the TFT substrate 170 has a structure in which the data line 104 and the drain electrode 110 are exposed. However, the TFT substrate can be sufficiently protected by an alignment film of an organic insulating material that will be formed on top of the TFT substrate in a later process.

Figure 7:
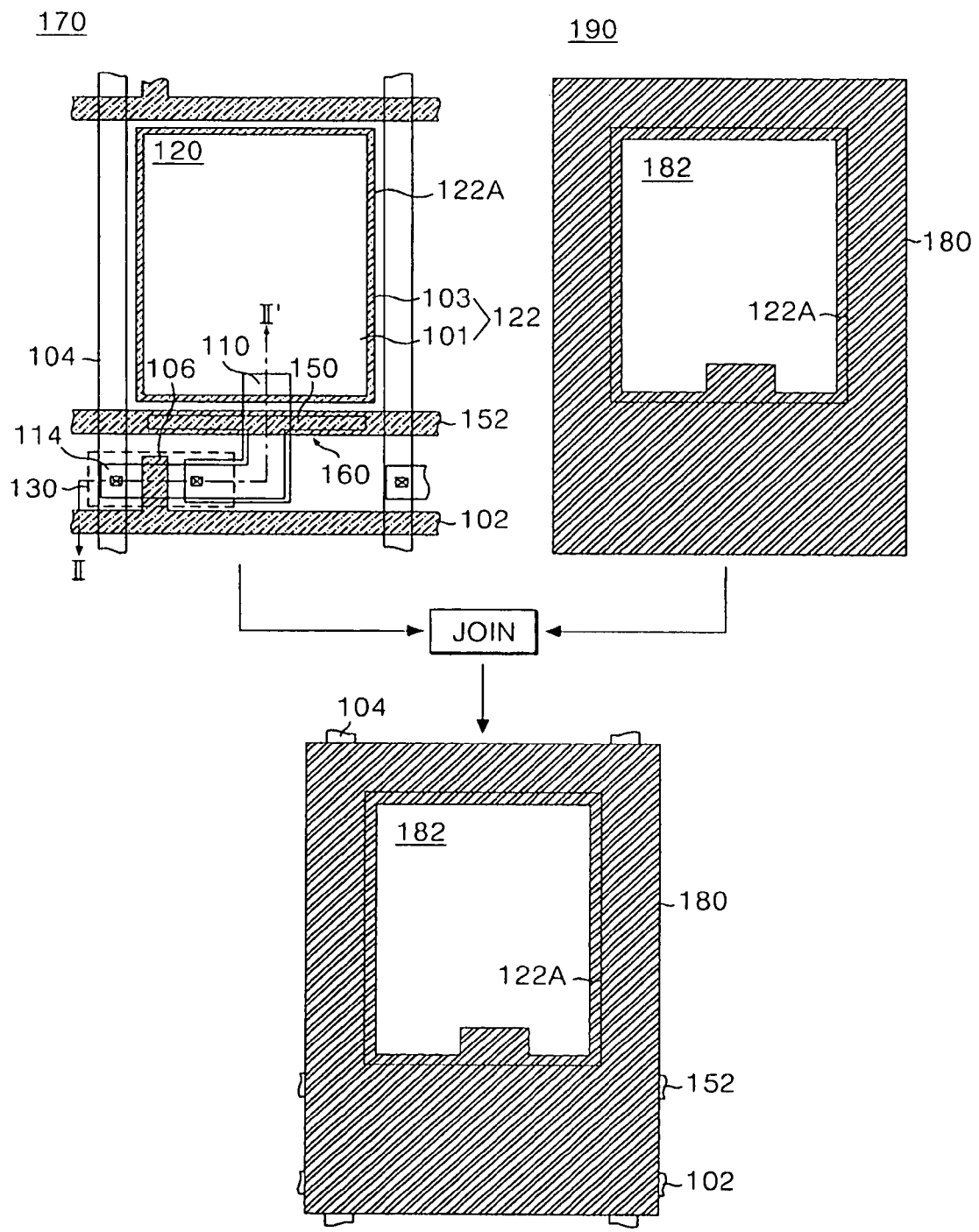
FIG. 7 is a plan view illustrating an assembly process in which the TFT substrate 170 of the first embodiment is attached to a color filter substrate.

FIG. 7 is a plan view illustrating an assembly process in which the TFT substrate 170 of the first embodiment is attached to a color filter substrate.

The poly-silicon liquid crystal display panel illustrated in FIG. 7 is provided by joining the TFT substrate 170 coated with a lower alignment film (not shown) and a color filter substrate 190 provided with a black matrix 180. In addition to the black matrix 180, the color filter substrate 190 further includes a color filter provided for each corresponding pixel area in such a manner to cover the black matrix 180, an over-coating layer for smoothing the color filter, a common electrode forming an electric field with the pixel electrode 122 of the TFT substrate 170, and an upper alignment film for aligning the liquid crystal.

The black matrix 180 includes an aperture portion 182 overlapping the pixel electrode 122 of the TFT substrate 170, which transmits light, while blocking light at the remaining area. As illustrated in FIG. 7, the aperture portion 182 of the black matrix 180 is about several µm smaller than the pixel electrode 122 in consideration of the process margin for the assembly process, and the black matrix 180 has a protrusion corresponding to the drain electrode 110, which reduces the size of the aperture portion 182.

Figure 8:
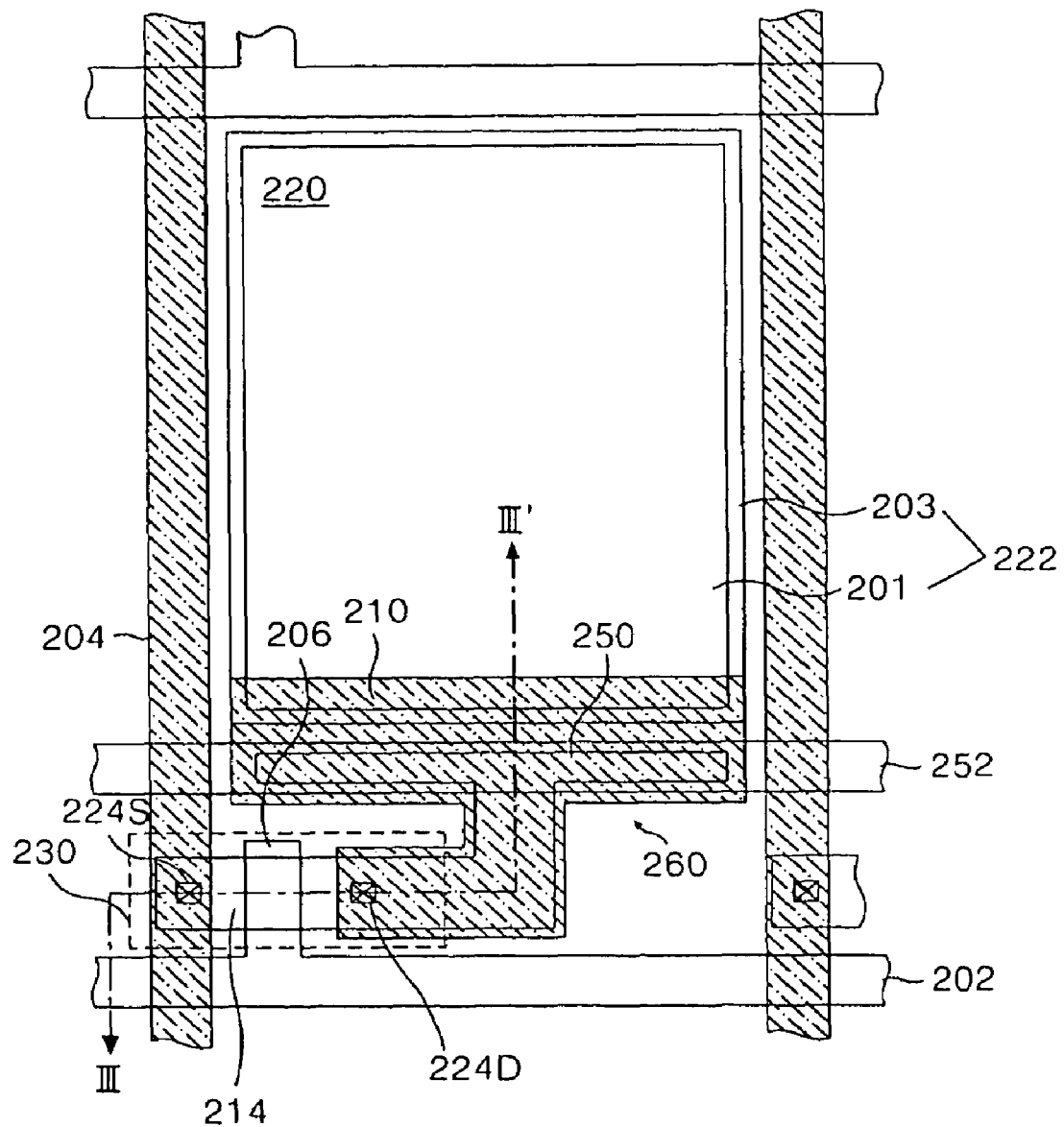
FIG. 8 is a plan view illustrating a portion of a thin film transistor substrate of poly-silicon liquid crystal display panel according to a second embodiment of the present invention.
Figure 9:
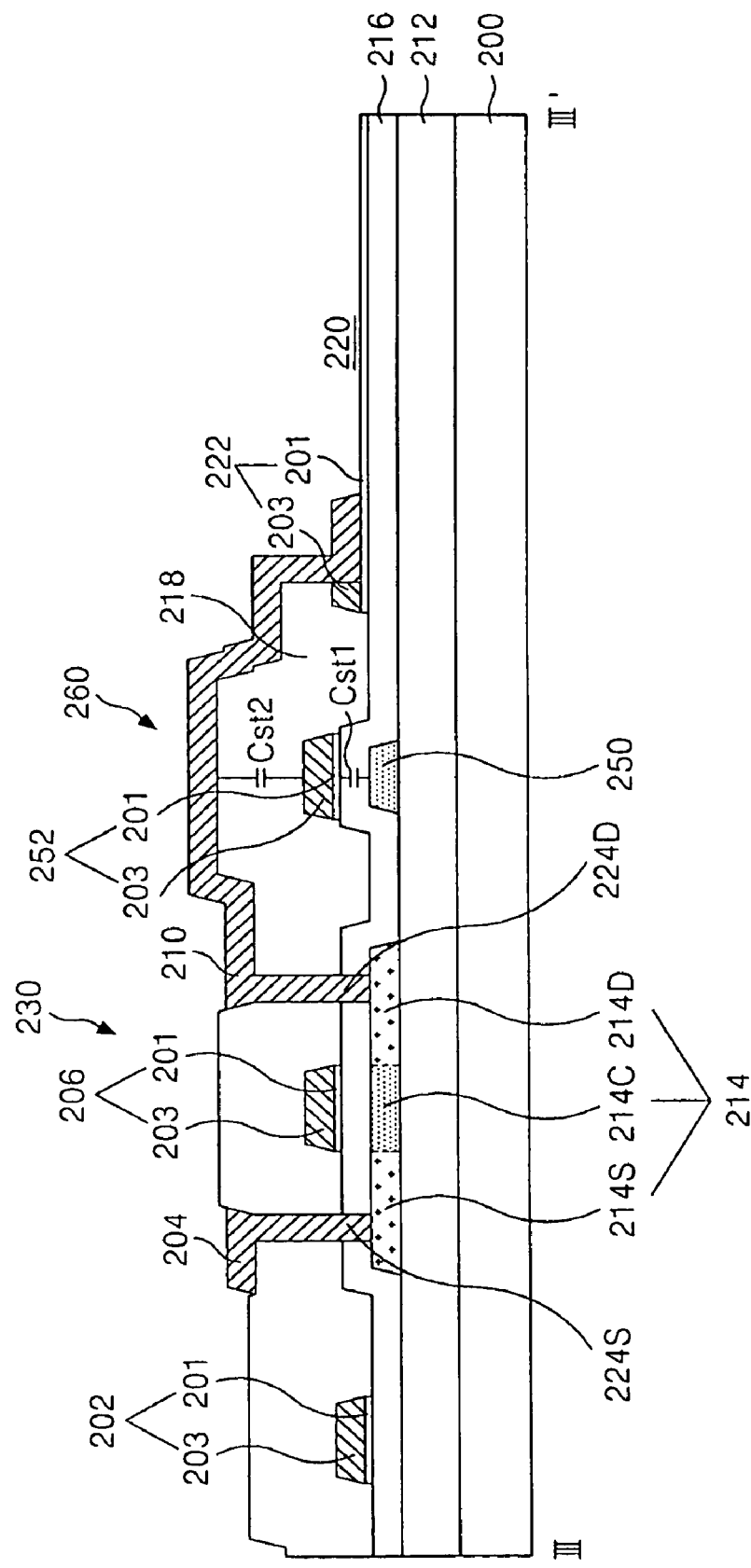
FIG. 9 is a cross-sectional view of the thin film transistor substrate taken along the line III-III' in FIG. 8.

In order to solve this problem, a poly-silicon liquid crystal display panel according to a second embodiment of the present invention includes a TFT substrate 270 in which a drain electrode 210 is enlarged as illustrated in FIG. 8 and FIG. 9. FIG. 8 is a plan view illustrating a portion of a thin film transistor substrate of poly-silicon liquid crystal display panel according to the second embodiment of the present invention, and FIG. 9 is a cross-sectional view of the thin film transistor substrate taken along the line III-III' in FIG. 8.

The TFT substrate 270 illustrated in FIGS. 8 and 9 has the same structure as the TFT substrate 170 illustrated in FIGS. 4 and 5, except that it includes the drain electrode 210 is enlarged to cover the overlapping area between a storage line 252 and a pixel electrode 222.

In the poly-type TFT substrate 270, a gate line 202, a gate electrode 206 and a storage line 252 are formed on a gate insulating film 216, all of which have a double-layer structure in which a metal layer 203 is formed on a transparent conductive layer 201. The pixel electrode 222 includes the transparent conductive layer 201 provided on the gate insulating film 216. The transparent conductive layer 201 is exposed through a transmitting hole 210 passing through an interlayer insulating film 218. Further, the pixel electrode 222 includes the metal layer 203 on the transparent conductive layer 201. The metal layer 203 having a rectangular shape encloses a periphery of the transmitting hole 210.

A TFT 230 includes a first active layer 214 provided on a buffer film 212 on a substrate 200, a gate electrode 206 overlapping a channel area 214C of the first active layer 214 with the gate insulating film 216 therebetween, and a source electrode and a drain electrode connected to a source area 214S and a drain area 214D of the first active layer 214 via a source contact hole 224S and a drain contact hole 224D passing through the interlayer insulating film 218 and the gate insulating film 216. The source electrode can be formed either as a part of the data line 204 or as a protrusion from the data line 204.

The drain electrode 210 overlaps the storage line 252 with the interlayer insulating film 218 therebetween and is connected to the pixel electrode 222 via the transmitting hole 220. More specifically, the drain electrode 210 is enlarged so that it is adjacent to both data lines 202 and connected to an inner side of the pixel electrode 222 via the transmitting hole 220. As a result, an overlapping area between the drain electrode 210 and the storage line 252 is enlarged, thereby increasing a capacitance value of a storage capacitor 260.

More specifically, the storage capacitor 260 includes first and second storage capacitors Cst1 and Cst2 connected in parallel between the storage line 252 and the TFT 230. The first storage capacitor Cst1 is provided such that the storage line 252 overlaps a second active layer 250 extended from the first active layer 214 of the TFT 230 with the gate insulating film 212 therebetween. The second storage capacitor Cst2 is provided such that the drain electrode 210 crosses the storage line 252 with the interlayer insulating film 218 therebetween. Due to the enlargement in the overlapping area between the drain electrode 210 and the storage line 252, a capacitance value of the second storage capacitor Cst2 increases and thus a total capacitance value of the storage capacitor 260 also increases. Accordingly, the storage capacitor 260 maintains video signals charged in the pixel electrode 222 more stably.

Furthermore, a portion of the drain electrode 210 overlapping with the storage line 252 and the pixel electrode 222 is located within an aperture portion of a black matrix (not shown). Accordingly, it becomes possible to minimize or prevent the reduction in the aperture ratio caused by the process margin for the assembly process. Also, the drain electrode 210 exposed through the aperture portion of the black matrix reflects an external light to thereby improve the contrast ratio.

Figure 10A:
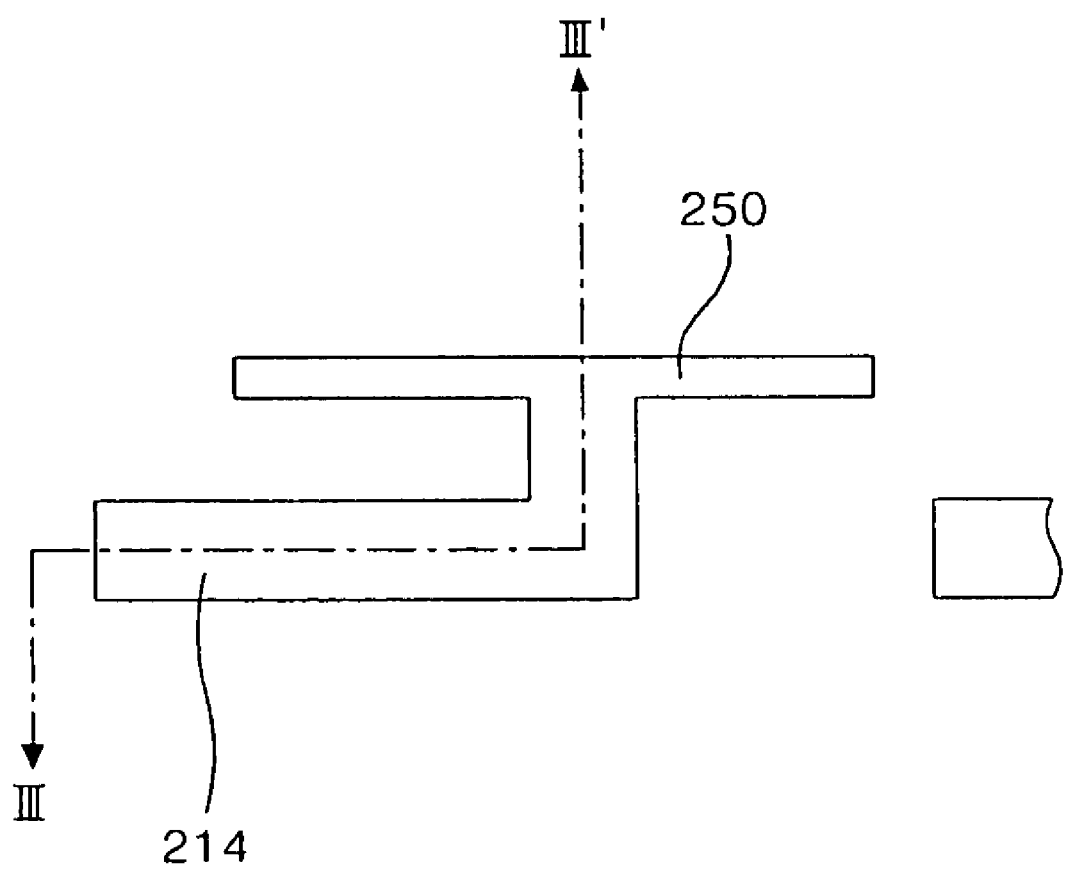
FIG. 10A and FIG. 10B are a plan view and a cross-sectional view, respectively, illustrating a first mask process in a method of fabricating the thin film transistor substrate according to the second embodiment of the present invention.
Figure 10B:
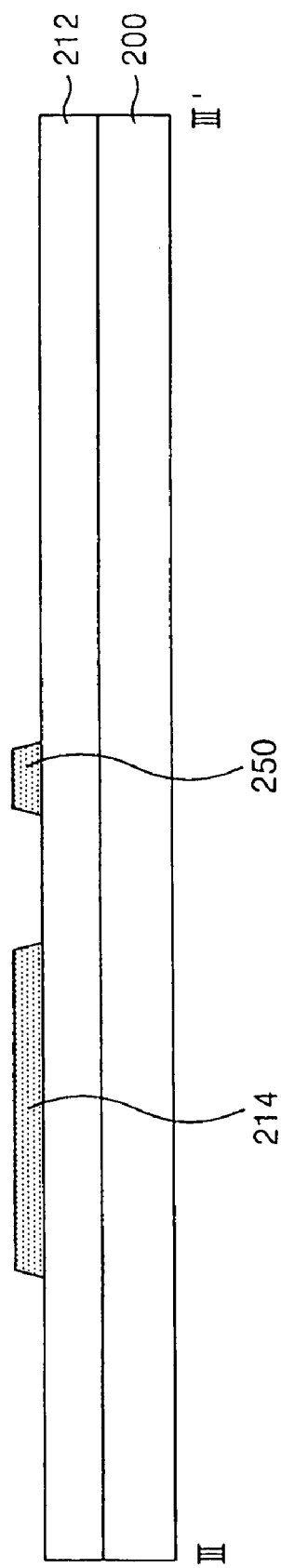

The TFT substrate according to the second embodiment of the present invention can be fabricated by a four-mask process, which will now be described. FIGS. 10A and 10B are a plan view and a cross-sectional view, respectively, illustrating a first mask process in a method of fabricating the thin film transistor substrate according to the second embodiment of the present invention.

Referring to FIGS. 10A and 10B, the buffer film 212 is formed on the lower substrate 200, and then the first and second active layers 214 and 250 are formed thereon by the first mask process.

The buffer film 212 is formed by entirely depositing an inorganic insulating film such as $SiO_2$, etc. onto the lower substrate 200. Next, an amorphous silicon thin film is formed by a low pressure chemical vapor deposition (LPCVD) technique or a plasma enhanced chemical vapor deposition (PECVD) technique, etc. and then is crystallized to thereby form a poly-silicon thin film. A dehydrogenization process may be used to reduce hydrogen atoms existing in the amorphous silicon thin film prior to the crystallization of the amorphous silicon thin film.

A laser annealing (ELA) technique such as the sequential lateral solidification (SLS) can be employed to crystallize the amorphous-silicon thin film, where grains grow in a horizontal direction to enlarge a size of the grains. The poly-silicon thin film is then patterned by photolithography and etching processes using a first mask to thereby form the first and second active layers 214 and 250.

Figure 11A:
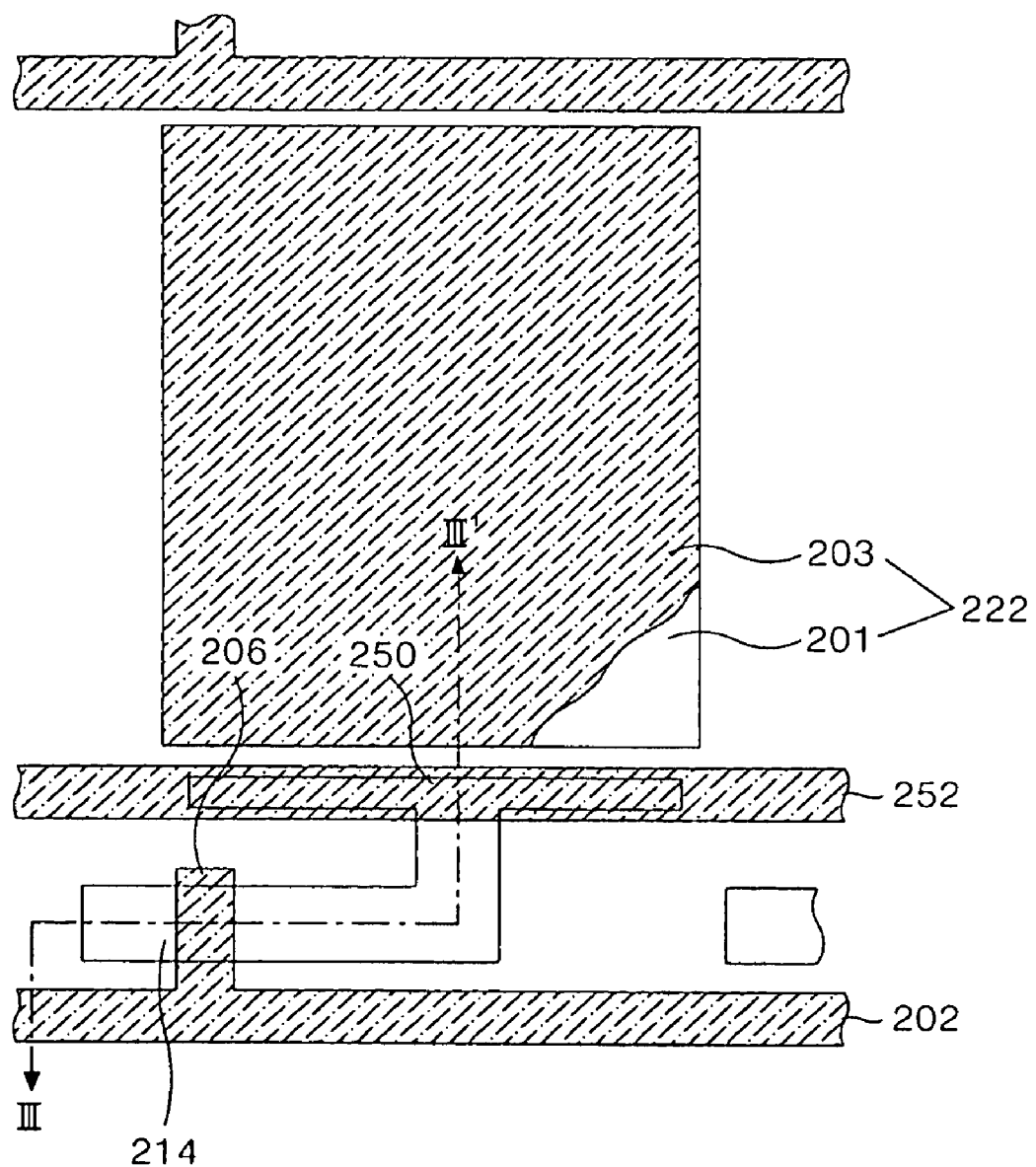
FIG. 11A and FIG. 11B are a plan view and a cross-sectional view, respectively, illustrating a second mask process in a method of fabricating the thin film transistor substrate according to the second embodiment of the present invention.
Figure 11B:
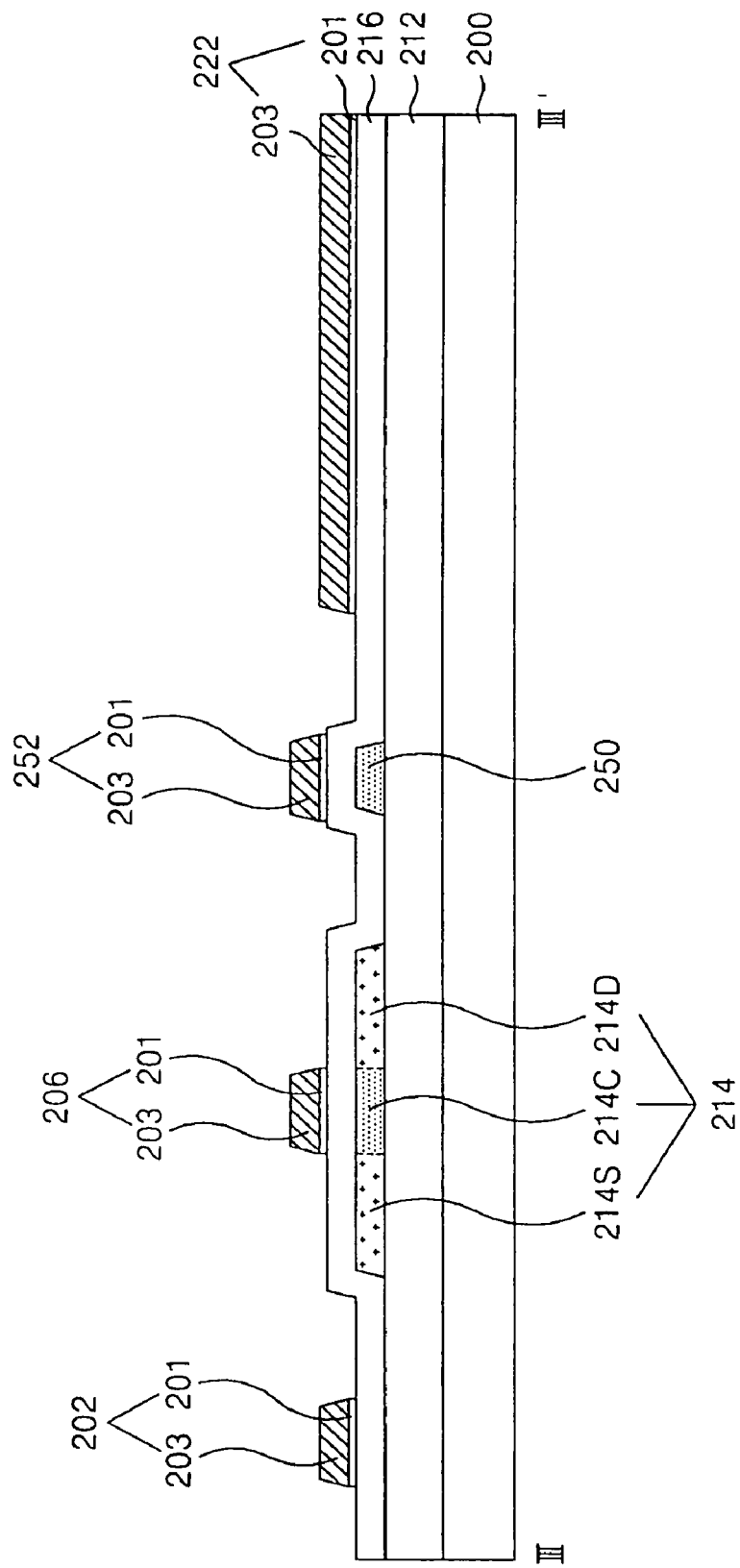

FIGS. 11A and 11B are a plan view and a cross-sectional view, respectively, illustrating a second mask process in a method of fabricating the thin film transistor substrate according to the second embodiment of the present invention.

Referring to FIGS. 11A and 11B, the gate insulating film 216 is formed on the buffer film 212 provided with the first and second active layers 214 and 250, and the pixel electrode 222, along with a double-layer structure of the gate line 202, the gate electrode 206 and the storage line 252, is formed thereon by the second mask process.

The gate insulating film 216 is provided by entirely depositing an inorganic insulating film such as $SiO_2$, etc. onto the buffer film 212 provided with the first and second active layers 214 and 250. Then, the transparent conductive layer 201 and the metal layer 203 are deposited on the gate insulating film 216 by the sputtering, etc. The transparent conductive layer 201 is formed of indium-tin-oxide (ITO), tin-oxide (TO) or indium-zinc-oxide (IZO), etc., whereas the metal layer 203 is formed of Mo, Cu, Al, Ti, Cr, MoW or AlNd, etc. Next, the metal layer 203 and the transparent conductive layer 201 are patterned by photolithography and etching processes using a second mask to thereby form the gate line 202, the gate electrode 206 and the storage line 252 along with the pixel electrode 222, all of which have a double-layer structure.

Further, an $n^+$ type impurity is doped into the first active layer 214 using the gate electrode 206 as a mask to thereby form the source area 214S and the drain area 214D of the first active layer 214. The source and drain electrodes 214S and 214D of the first active layer 214 are opposed to each other, with a channel area 214C overlapping the gate electrode 206 therebetween.

Figure 12A:
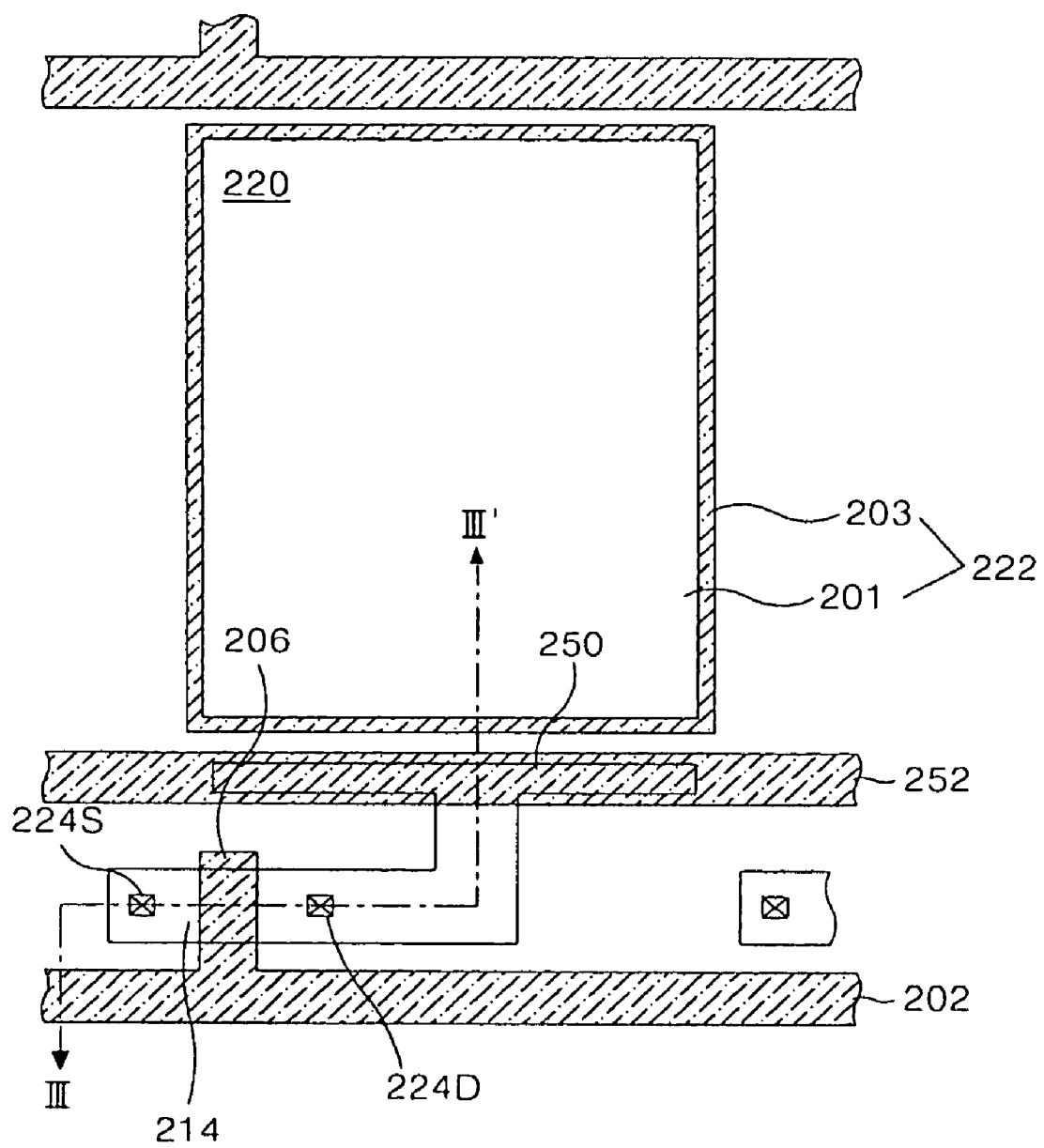
FIG. 12A and FIG. 12B are a plan view and a cross-sectional view, respectively, illustrating a third mask process in a method of fabricating the thin film transistor substrate according to the second embodiment of the present invention.
Figure 12B:
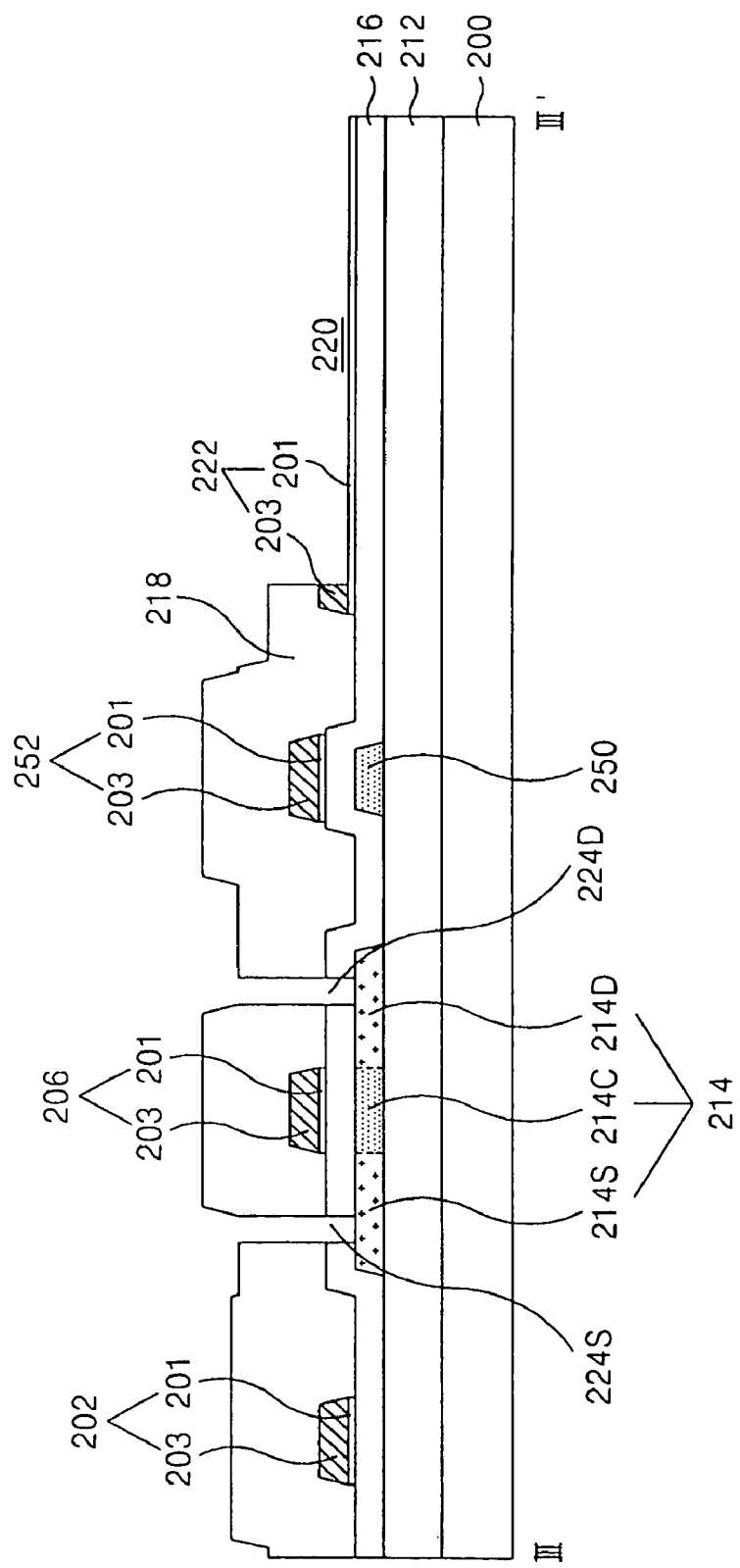

FIGS. 12A and 12B are a plan view and a cross-sectional view, respectively, illustrating a third mask process in a method of fabricating the thin film transistor substrate according to the second embodiment of the present invention.

Referring to FIGS. 12A and 12B, the source and drain contact holes 224S and 224D and the interlayer insulating film 218 having the transmitting hole 120 are formed on the gate insulating film 216 provided with the gate line 202, the gate electrode 206, the storage line 252 and the pixel electrode 222 by a third mask process.

The interlayer insulating film 218 is formed by entirely depositing an inorganic insulating material such as $SiO_2$, etc. onto the gate insulating film 216 provided with the gate electrode 206, the gate line 202, the storage line 252 and the pixel electrode 222. Then, the source and drain contact holes 224S and 224D passing through the interlayer insulating film 218 and the gate insulating film 216 to expose the source area 214S and the drain area 214D of the first active layer 214, and the transmitting hole 220 exposing the pixel electrode 222 are formed by photolithography and etching processes using a third mask. Further, the metal layer 203 of the pixel electrode 222 exposed through the transmitting hole 220 is etched to expose the transparent conductive layer 201.

Figure 13A:
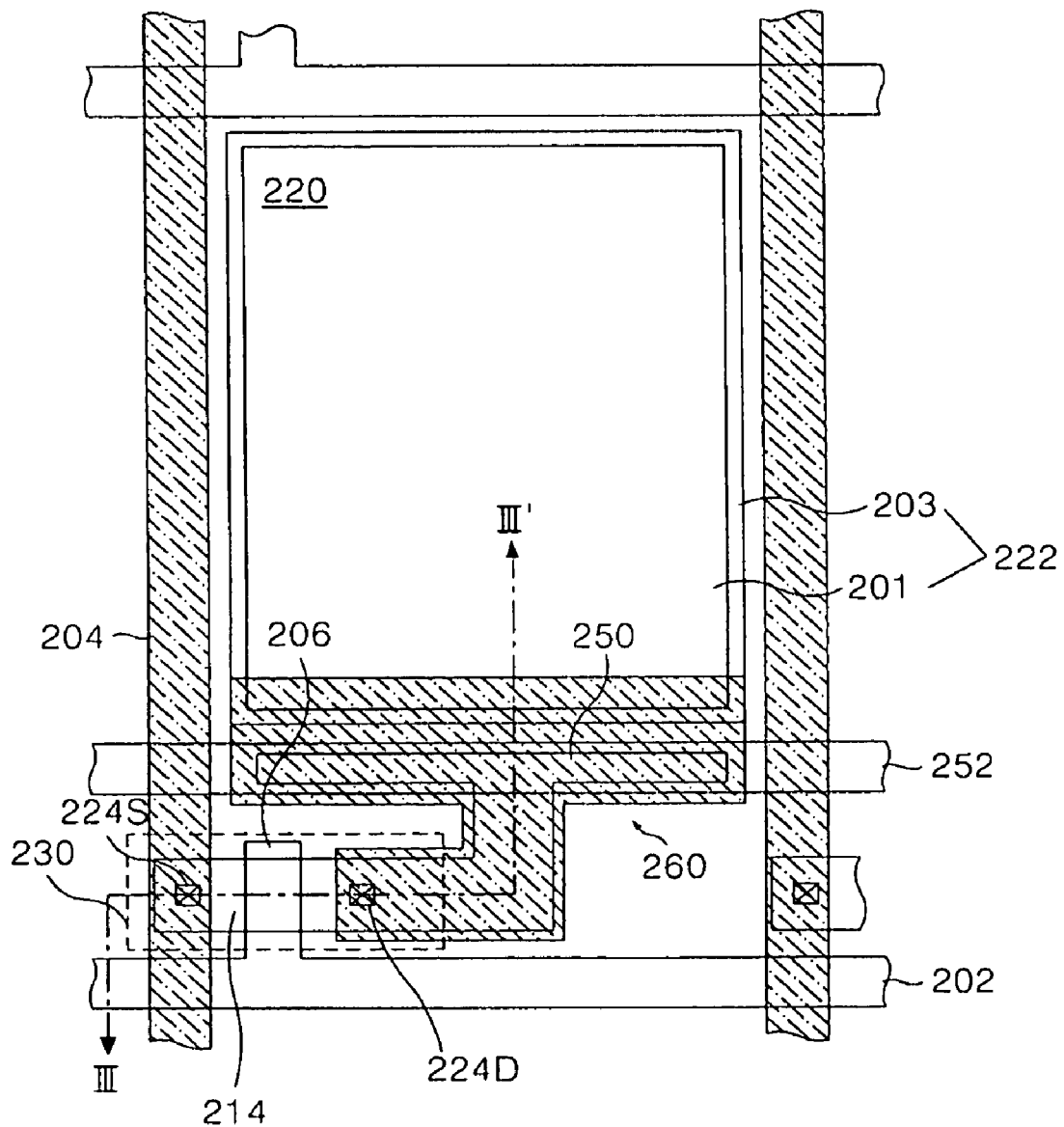
FIG. 13A and FIG. 13B are a plan view and a cross-sectional view, respectively, illustrating a fourth mask process in a method of fabricating the thin film transistor substrate according to the second embodiment of the present invention.
Figure 13B:
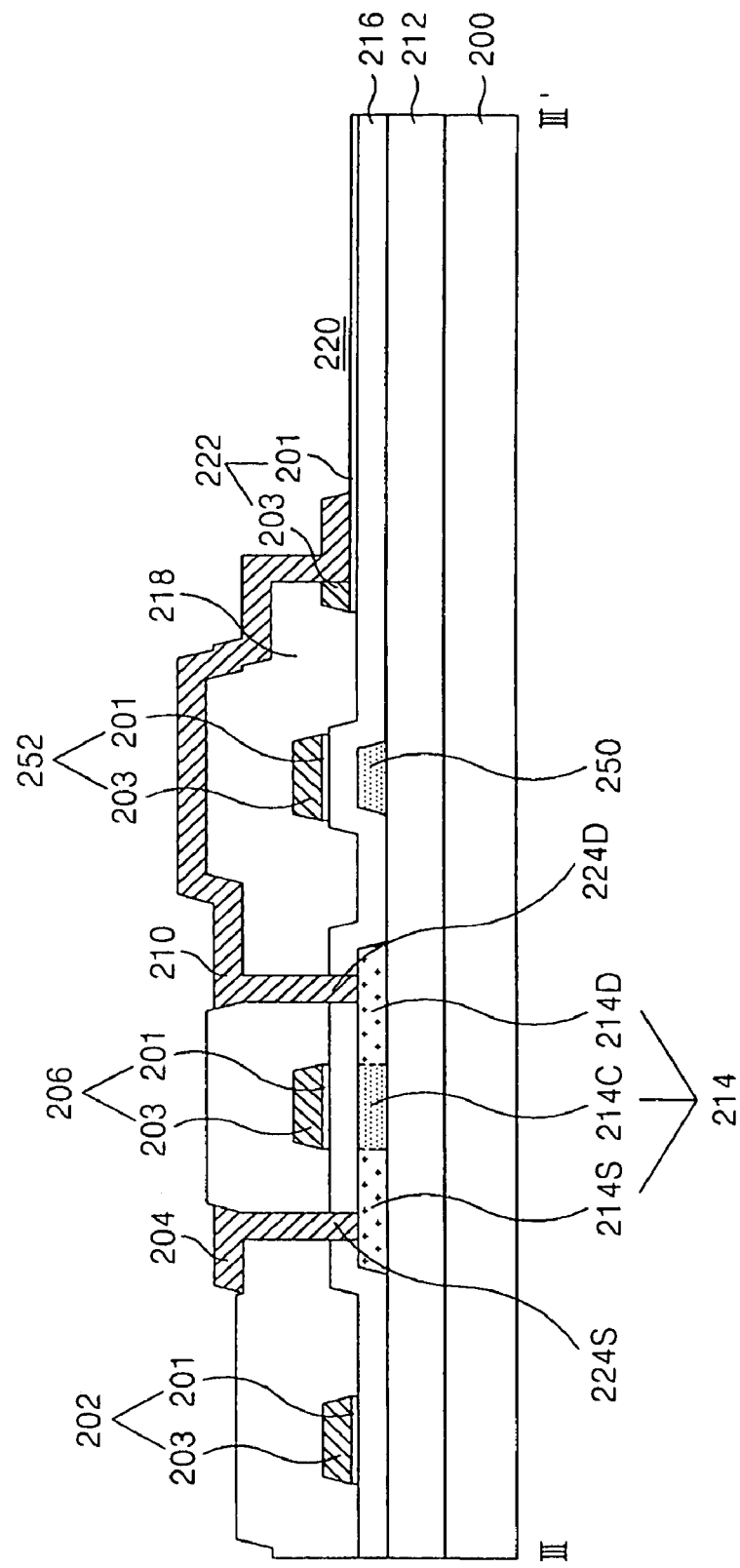

FIGS. 13A and 13B are a plan view and a cross-sectional view, respectively, illustrating a fourth mask process in a method of fabricating the thin film transistor substrate according to the second embodiment of the present invention.

Referring to FIGS. 13A and 13B, the data line 204 including the source electrode and the drain electrode 210 are formed on the interlayer insulating film 218 by a fourth mask process.

The data line 204 including the source electrode and the drain electrode 210 are formed by depositing a source/drain metal layer on the interlayer insulating film 218 and then patterning the source/drain metal layer by photolithography and etching processes using a fourth mask. The data line 204 and the drain electrode 210 are connected to the source and drain areas 214S and 214D of the first active layer 214 via the source and drain contact holes 224S and 224D. The drain electrode 210 overlaps the storage line 252 and is connected to the pixel electrode 222 via the transmitting hole 220. In this case, the drain electrode 210 is adjacent to both data lines 204 and connected to a lower portion of the pixel electrode 222.

Further, the data line 204 and the drain electrode 210 can be sufficiently protected by an alignment film form of an organic insulating material provided at the uppermost layer of the TFT substrate in a subsequent liquid crystal alignment process.

Figure 14:
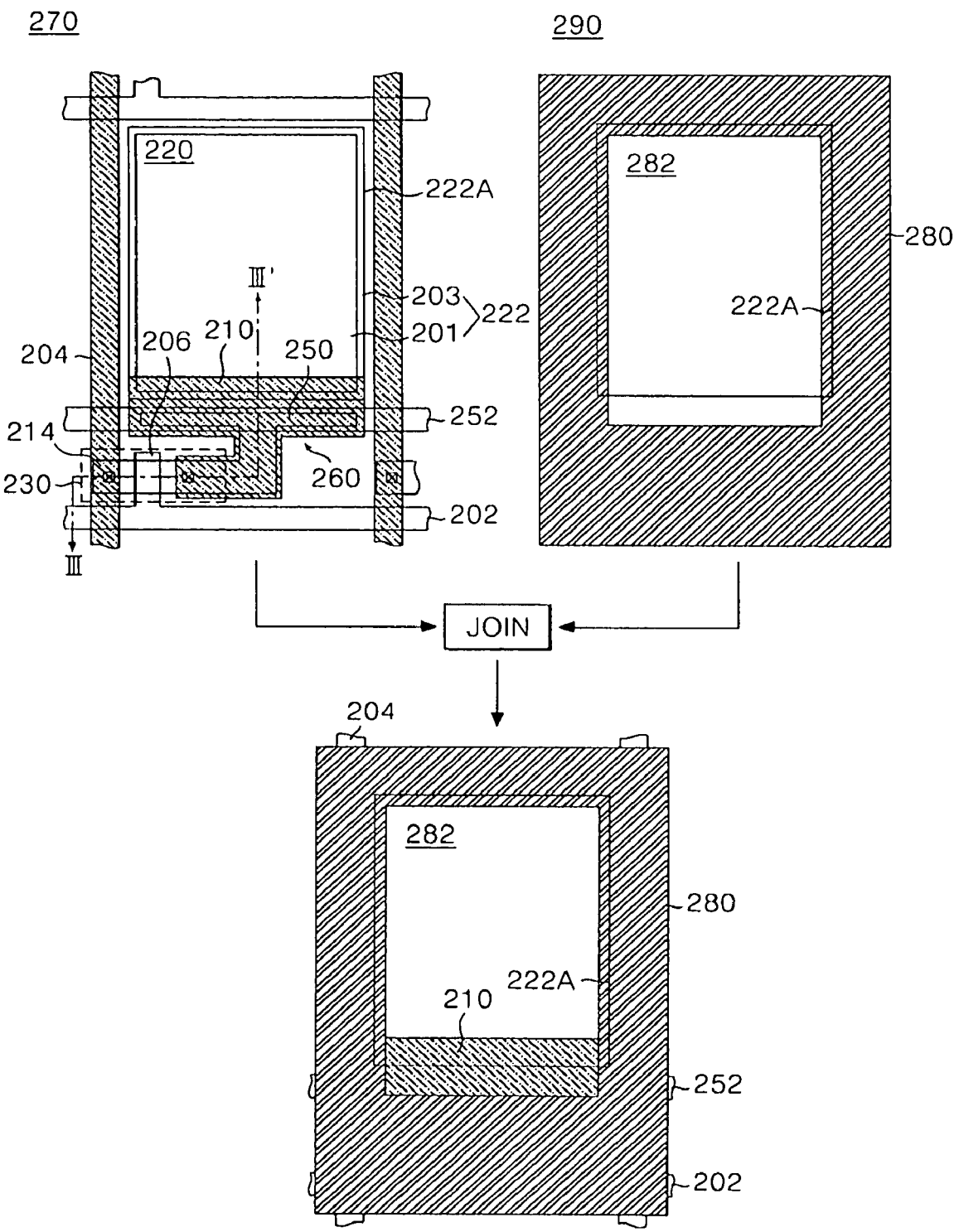
FIG. 14 is a plan view illustrating an assembly process in which the TFT substrate 270 of the second embodiment is attached to a color filter substrate.

FIG. 14 is a plan view illustrating an assembly process in which the TFT substrate 270 of the second embodiment is attached to a color filter substrate.

The poly-silicon liquid crystal display panel illustrated in FIG. 14 is provided by joining the TFT substrate 270 coated with a lower alignment film (not shown) and a color filter substrate 290 provided with the black matrix 280. In addition to the black matrix 280, the color filter substrate 290 further includes a color filter provided for each corresponding pixel area in such a manner to cover the black matrix 280, an over-coating layer for smoothing the color filter, a common electrode forming an electric field with the pixel electrode 222 of the TFT substrate 270, and an upper alignment film for aligning the liquid crystal.

The black matrix 280 includes an aperture portion 282 overlapping the pixel electrode 222 of the TFT substrate 270, which transmits light, while blocking light at the remaining area. As illustrated in FIG. 14, only the left, right and upper sides of the aperture portion 282 are smaller than the pixel electrode 222 in consideration of the process margin for the assembly process. Because of the drain electrode 210 of a metal layer, the lower side of the aperture portion 282 can be designed without taking the alignment process margin into consideration. Thus, it becomes possible to minimize the reduction in the aperture ratio caused by the process margin for the assembly process. Also, the drain electrode 210 exposed through the aperture portion 282 of the black matrix 280 reflects an external light to thereby improve the contrast ratio.

Figure 15:
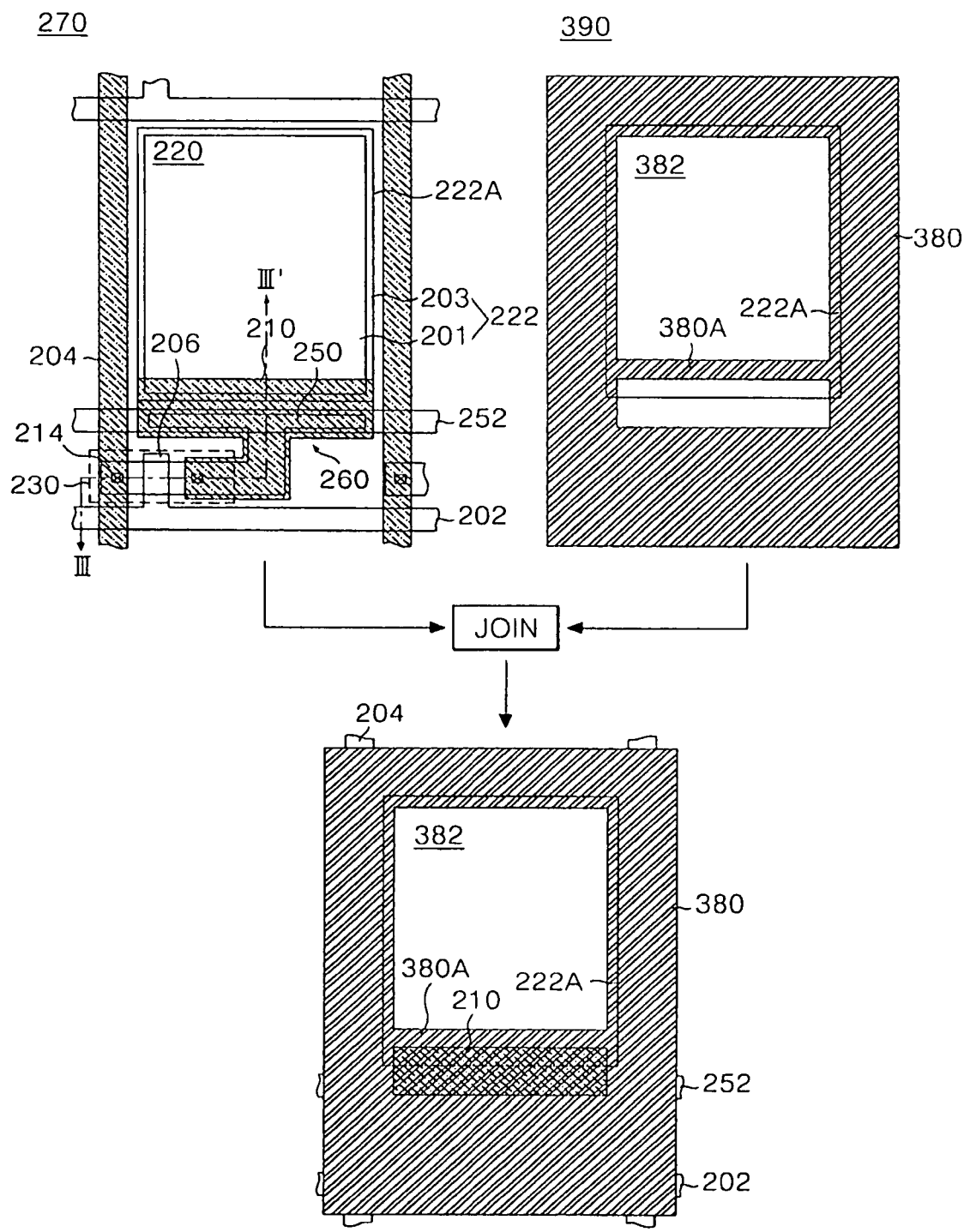
FIG. 15 is a plan view illustrating a poly-silicon liquid crystal display panel according to a third embodiment of the present invention and an assembly process.

FIG. 15 is a plan view illustrating a poly-silicon liquid crystal display panel according to a third embodiment of the present invention and an assembly process.

The poly-silicon liquid crystal display panel illustrated in FIG. 15 has the same elements as the poly-silicon liquid crystal display panel illustrated in FIG. 14, except that a black matrix 380 of a color filter substrate 390 further includes a bridge 380A crossing a lower portion of an aperture portion 382.

The bridge 380A of the black matrix 380 illustrated in FIG. 15 is provided in such a manner to cross the aperture portion 382. Thus, the aperture portion 382 is separated into the upper and lower portions thereof. The drain electrode 210 has a step coverage resulting from a height of the transmitting hole 220, which may cause a light leakage. Thus, the bridge 380A of the black matrix 380 can prevent such a light leakage from contributing to displaying images. Thus, when the TFT substrate 270 is attached to the color filter substrate 390, the upper portion of the aperture 382 with respect to the bridge 380A exposes the pixel electrode 222 while the lower portion thereof exposes the drain electrode 210. Accordingly, Thus, it becomes possible to minimize the reduction in the aperture ratio caused by the process margin for the assembly process. Also, the drain electrode 210 exposed through the aperture portion 382 of the black matrix 380 reflects an external light to thereby improve the contrast ratio.

As described above, a TFT substrate of a poly-silicon display device according to the present invention is fabricated by a simplified four-mask process, thereby reducing the manufacturing cost. Further, because of the enlarged overlapping area between the drain electrode and the storage line, the storage capacitor has a higher capacitance value and it becomes possible to minimize the reduction in the aperture ratio caused by the process margin for the assembly process. Moreover, according to the present invention, the drain electrode expanded through the aperture portion of the black matrix reflects an external light, thereby improving the contrast ratio. In addition, when the bridge of the black matrix is further provided, it becomes possible to prevent or minimize a light leakage resulting from a step coverage of the drain electrode.

It will be apparent to those skilled in the art that various modifications and variations can be made in the present invention. Thus, it is intended that the present invention covers the modifications and variations of this invention provided they come within the scope of the appended claims and their equivalents.

What is claimed is:

1. A liquid crystal display device, comprising:
   first and second substrates;
   a gate line on the first substrate;
   a data line crossing the gate line to define a pixel region;
   a thin film transistor (TFT) near the crossing of the gate and data lines, the TFT having a gate electrode, a source electrode and a drain electrode;
   a pixel electrode in the pixel region, the pixel electrode having a double-layer structure in which a metal layer is formed on a transparent conductive layer;
   a black matrix on the second substrate, the black matrix having an aperture portion partially overlapping the pixel electrode and the drain electrode; and
   a liquid crystal layer between the first and second substrates, wherein the gate line and the gate electrode connected to the gate line have the double-layer structure.

2. The device of claim 1, further comprising a storage line being parallel to the gate line.

3. The device of claim 2, wherein the storage line has the double-layer structure.

4. The device of claim 2, wherein the drain electrode is formed along the storage line and is adjacent to both sides of the data line.

5. The device of claim 2, wherein the drain electrode surrounds one portion of the pixel electrode adjacent to the storage line.

6. The device of claim 5, wherein the drain electrode overlaps the aperture portion of the black matrix and an overlapped portion between the storage line and the pixel electrode.

7. The device of claim 6, wherein a portion of the drain electrode overlapping the aperture portion of the black matrix reflects light.

8. The device of claim 1, further comprising an insulating film between the gate line and the data line.

9. The device of claim 8, wherein the pixel electrode is exposed via a transmission hole passing through the insulating film.

10. The device of claim 9, wherein the metal layer of the pixel electrode surrounds a periphery of the transmission hole.

11. The device of claim 1, further comprising a first active layer between the source electrode and the drain electrode.

12. The device of claim 11, further comprising a first storage capacitor overlapping between a second active layer extended from the first active layer and the storage line.

13. The device of claim 12, further comprising a second storage capacitor overlapping between the drain electrode and the storage line.

14. The device of claim 1, wherein the black matrix further includes a bridge crossing the aperture portion.

* * * * *